US008717758B2

(12) United States Patent  (10) Patent No.: US 8,717,758 B2
Allen  (45) Date of Patent: May 6, 2014

(54) LOCKING ASSEMBLY FOR ELECTRONIC TABLET AND OTHER DEVICES

(75) Inventor: Peter Allen, Locust Valley, NY (US)

(73) Assignee: Think Products, Inc., Hauppauge, NY (US)

( * ) Notice: Subject to any disclaimer, the term of this patent is extended or adjusted under 35 U.S.C. 154(b) by 0 days.

(21) Appl. No.: 13/526,514

(22) Filed: Jun. 18, 2012

(65) Prior Publication Data

US 2012/0272693 A1    Nov. 1, 2012

Related U.S. Application Data

(63) Continuation of application No. 13/031,174, filed on Feb. 18, 2011, now Pat. No. 8,223,488, which is a continuation-in-part of application No. 12/657,670, filed on Jan. 25, 2010, now Pat. No. 8,139,356, which is a continuation-in-part of application No. 12/154,561, filed on May 23, 2008, now Pat. No. 7,724,520, which is a continuation-in-part of application No. 11/454,433, filed on Jun. 15, 2006, now Pat. No. 7,443,665, which is a continuation-in-part of application No. 11/359,871, filed on Feb. 22, 2006, now Pat. No. 7,324,333.

(60) Provisional application No. 60/655,270, filed on Feb. 22, 2005, provisional application No. 60/678,911, filed on May 6, 2005, provisional application No. 60/691,476, filed on Jun. 17, 2005, provisional application No. 60/725,333, filed on Oct. 11, 2005, provisional application No. 60/757,737, filed on Jan. 10, 2006, provisional application No. 60/783,188, filed on Mar. 16, 2006.

(51) Int. Cl.
| | |
|---|---|
| *H05K 5/00* | (2006.01) |
| *H05K 7/00* | (2006.01) |
| *E05B 69/00* | (2006.01) |
| *E05B 73/00* | (2006.01) |
| *H01L 23/34* | (2006.01) |
| *A47B 81/00* | (2006.01) |
| *A47B 97/00* | (2006.01) |

(52) U.S. Cl.
USPC .............. 361/679.57; 361/679.58; 312/223.2; 211/8; 211/9; 257/727; 70/15; 70/50

(58) Field of Classification Search
USPC .......... 361/679.57, 679.58; 312/221.1, 221.2, 312/223.2; 211/8, 9; 257/727; 70/15, 50
See application file for complete search history.

(56) References Cited

U.S. PATENT DOCUMENTS

| 3,181,319 A | 5/1965 | Hudon |
| 3,275,160 A | 9/1966 | Zurker |

(Continued)

FOREIGN PATENT DOCUMENTS

| CA | 454901 | 3/1949 |
| CA | 791364 | 8/1968 |

(Continued)

*Primary Examiner* — Anthony Haughton
(74) *Attorney, Agent, or Firm* — Alfred M. Walker; John F. Vodopia

(57) ABSTRACT

A method for securing a portable electronic device having a housing to a substantially immovable object utilizing a locking assembly having a security rod or spike formed with an anchoring end separated axially by a protruding end, a locking device with an internal locking mechanism and a cable permanently attached to the locking device at one end, includes the steps of securedly fixing the anchoring end of the security rod or spike to the portable electronic device upon or through the housing, attaching an other end of the cable to the substantially immovable object and inserting the protruding end of the security rod into an opening in the locking device to actuate the internal locking mechanism and lock the locking device to the captive security rod. Locking the security rod to the locking device concurrently locks the portable electronic device to which it is anchored to the substantially immovable object.

16 Claims, 41 Drawing Sheets

(56) References Cited

U.S. PATENT DOCUMENTS

| | | |
|---|---|---|
| 3,410,122 A | 11/1968 | Moses |
| 3,410,580 A | 11/1968 | Longenecker |
| 3,535,898 A | 10/1970 | Allport |
| 3,707,860 A | 1/1973 | Singer |
| RE28,187 E | 10/1974 | Longenecker |
| 3,945,227 A | 3/1976 | Reiland |
| 3,965,705 A | 6/1976 | Nadler |
| 4,009,599 A | 3/1977 | Patriquin |
| 4,066,231 A | 1/1978 | Bahner |
| 4,418,553 A | 12/1983 | Applegate |
| 4,426,863 A | 1/1984 | Gillette |
| 4,696,449 A | 9/1987 | Woo |
| 4,733,840 A | 3/1988 | D'Amore |
| 4,738,428 A | 4/1988 | Themistos |
| 4,821,538 A | 4/1989 | Gray |
| 4,856,304 A | 8/1989 | Derman |
| 4,870,842 A | 10/1989 | Plumer |
| 5,052,198 A | 10/1991 | Watts |
| 5,052,199 A | 10/1991 | Derman |
| 5,076,079 A | 12/1991 | Monoson |
| 5,082,232 A | 1/1992 | Wilson |
| 5,085,395 A | 2/1992 | Frater |
| 5,135,197 A | 8/1992 | Kelley |
| 5,154,456 A | 10/1992 | Moore |
| 5,169,114 A | 12/1992 | O'Neill |
| 5,265,449 A | 11/1993 | Rashleigh |
| 5,345,219 A | 9/1994 | Rogers |
| 5,351,507 A | 10/1994 | Derman |
| 5,351,508 A | 10/1994 | Kelley |
| 5,361,610 A | 11/1994 | Sanders |
| 5,381,685 A | 1/1995 | Carl |
| 5,406,809 A | 4/1995 | Igelmund |
| 5,446,618 A | 8/1995 | Tetsuya |
| 5,469,726 A | 11/1995 | Rushing |
| 5,493,878 A | 2/1996 | Murray |
| 5,502,989 A * | 4/1996 | Murray et al. ............ 70/58 |
| 5,526,226 A * | 6/1996 | Katoh et al. ............ 361/679.09 |
| 5,531,082 A | 7/1996 | Wolk |
| 5,542,723 A | 8/1996 | Scharf |
| 5,560,481 A | 10/1996 | Doodson |
| 5,568,359 A | 10/1996 | Cavello |
| 5,582,044 A | 12/1996 | Bolich |
| 5,595,074 A | 1/1997 | Munro |
| 5,608,605 A * | 3/1997 | Siow et al. ............ 361/679.43 |
| 5,645,261 A | 7/1997 | Glynn |
| 5,709,110 A * | 1/1998 | Greenfield et al. ............ 70/58 |
| 5,760,690 A | 6/1998 | French |
| 5,762,306 A | 6/1998 | Day |
| 5,787,738 A | 8/1998 | Brandt |
| 5,787,739 A | 8/1998 | Derman |
| 5,794,463 A | 8/1998 | McDaid |
| 5,816,076 A | 10/1998 | Biedermann |
| 5,836,183 A | 11/1998 | Derman |
| D405,348 S | 2/1999 | Orr |
| 5,926,092 A | 7/1999 | Kim |
| 5,927,108 A | 7/1999 | Pierce |
| D415,950 S | 11/1999 | Anderson |
| 6,000,252 A | 12/1999 | Murray |
| 6,006,557 A | 12/1999 | Carl |
| D425,402 S | 5/2000 | Welborn |
| 6,138,483 A | 10/2000 | Galant |
| 6,155,088 A | 12/2000 | Murray |
| D436,310 S | 1/2001 | Arnold |
| 6,178,089 B1 | 1/2001 | Alfonso |
| 6,182,481 B1 * | 2/2001 | Nagy ............ 70/58 |
| 6,185,964 B1 | 2/2001 | Addiego |
| 6,212,921 B1 | 4/2001 | Knighton |
| 6,216,499 B1 | 4/2001 | Ronberg |
| 6,237,375 B1 | 5/2001 | Wymer |
| 6,257,542 B1 | 7/2001 | Westfield |
| 6,275,378 B1 | 8/2001 | Lee |
| 6,308,928 B1 | 10/2001 | Galant |
| 6,317,936 B1 | 11/2001 | McDaid |
| 6,331,934 B1 | 12/2001 | Helot |
| 6,427,499 B1 | 8/2002 | Derman |
| 6,443,417 B2 | 9/2002 | Galant |
| 6,477,870 B1 | 11/2002 | Derman |
| 6,477,871 B1 | 11/2002 | Shaw |
| 6,497,125 B1 | 12/2002 | Necchi |
| 6,560,710 B1 | 5/2003 | Leyden |
| 6,578,394 B2 | 6/2003 | Yin |
| 6,581,420 B1 | 6/2003 | Ling |
| 6,590,767 B2 | 7/2003 | Liao |
| 6,612,455 B2 | 9/2003 | Byrne |
| D485,060 S | 1/2004 | DeCotis |
| 6,684,548 B1 | 2/2004 | Petrus |
| 6,689,954 B2 | 2/2004 | Vaughan |
| 6,697,252 B2 | 2/2004 | Maeda |
| 6,705,133 B1 | 3/2004 | Avganim |
| 6,708,966 B1 | 3/2004 | Troudt |
| 6,711,921 B1 | 3/2004 | Yang |
| 6,735,990 B1 * | 5/2004 | Murray et al. ............ 70/58 |
| D491,009 S | 6/2004 | Burdett |
| 6,755,056 B2 | 6/2004 | Igelmund |
| 6,763,690 B2 | 7/2004 | Galant |
| 6,788,216 B2 | 9/2004 | Chen |
| 6,796,536 B1 | 9/2004 | Sevier |
| 6,810,698 B2 | 11/2004 | Weinraub |
| 6,820,362 B1 | 11/2004 | Petrus |
| D499,546 S | 12/2004 | Smithers |
| 6,865,914 B2 | 3/2005 | Irgens |
| D503,532 S | 4/2005 | Andre |
| 6,913,238 B2 | 7/2005 | Bakker |
| 6,920,770 B2 | 7/2005 | Lurie |
| 6,926,141 B2 | 8/2005 | Montler |
| 7,007,912 B1 | 3/2006 | Giuliani |
| D519,731 S | 5/2006 | Andre |
| D521,232 S | 5/2006 | Andre |
| 7,104,093 B2 | 9/2006 | Ling |
| D533,994 S | 12/2006 | Hussaini |
| 7,255,228 B2 | 8/2007 | Kim |
| D553,352 S | 10/2007 | Allen |
| D559,076 S | 1/2008 | Allen |
| 7,315,443 B2 | 1/2008 | Allen |
| D565,839 S | 4/2008 | Allen |
| 7,409,842 B2 | 8/2008 | Kuo |
| 7,443,665 B2 | 10/2008 | Allen |
| 7,499,269 B2 | 3/2009 | Allen |
| 7,499,270 B2 | 3/2009 | Allen |
| 7,647,796 B2 | 1/2010 | Francke |
| 7,963,132 B2 | 6/2011 | Andres |
| 8,107,236 B2 * | 1/2012 | Lin ............ 361/679.57 |
| 8,111,511 B2 * | 2/2012 | Ruch et al. ............ 361/679.57 |
| 2001/0049949 A1 | 12/2001 | Igelmund |
| 2003/0085143 A1 | 5/2003 | Yatabe |
| 2004/0007651 A1 | 1/2004 | Williams |
| 2005/0150263 A1 | 7/2005 | Murray |
| 2005/0161557 A1 | 7/2005 | Heintz |
| 2005/0178173 A1 | 8/2005 | Kuo |
| 2005/0247584 A1 | 11/2005 | Lu |
| 2006/0032877 A1 | 2/2006 | Obolo |
| 2006/0117814 A1 | 6/2006 | Francke |
| 2006/0176661 A1 | 8/2006 | Allen |
| 2007/0205125 A1 | 9/2007 | Ikebe |
| 2007/0235493 A1 | 10/2007 | Fortson |
| 2008/0110217 A1 | 5/2008 | Andrews |

FOREIGN PATENT DOCUMENTS

| | | |
|---|---|---|
| CA | 987121 | 4/1976 |
| DE | 329934 | 12/1920 |
| DE | 335741 | 4/1921 |
| DE | 361068 | 4/1923 |
| DE | 456219 | 2/1928 |
| DE | 577757 | 6/1933 |
| DE | 3202700 | 4/1983 |
| DE | 3407723 | 9/1985 |
| DE | 3824393 | 7/1989 |
| FR | 455740 | 8/1913 |
| FR | 877220 | 12/1942 |
| FR | 1026519 | 4/1953 |
| FR | 1085107 | 1/1955 |
| FR | 2308006 | 11/1976 |
| FR | 2636686 | 3/1990 |

(56) References Cited

FOREIGN PATENT DOCUMENTS

| | | |
|---|---|---|
| FR | 2741375 | 5/1997 |
| GB | 4470901 | 5/1936 |
| GB | 1256295 | 12/1971 |
| GB | 1376011 | 12/1974 |
| GB | 2109109 | 5/1983 |
| GB | 2234856 | 2/1991 |
| HU | P0000398 | 6/2000 |
| HU | 224329 | 6/2003 |
| IT | 451949 | 3/1949 |
| JP | 49-91096 | 11/1947 |
| JP | 37-7592 | 6/1959 |
| JP | 52-36813 | 3/1977 |
| JP | 57-25092 | 2/1982 |
| JP | 57-179618 | 11/1982 |
| JP | 08-7462 | 1/1996 |
| JP | 087462 | 1/1996 |
| JP | 2000-305845 | 11/2000 |
| JP | 2002149264 A | 5/2002 |
| JP | 2004318426 A | 11/2004 |
| JP | 2000-140948 | 5/2005 |
| NO | 14095 | 5/1905 |
| WO | WO86/00396 A1 | 1/1986 |
| WO | WO93/15295 A1 | 8/1993 |
| WO | WO95/10680 A1 | 5/1995 |
| WO | WO96/07002 A1 | 3/1996 |
| WO | WO96/5347 A1 | 5/1996 |
| WO | WO2008/051919 A2 | 5/2008 |
| WO | WO2008/051930 A2 | 5/2008 |
| WO | PCT2008067173 A2 | 6/2008 |
| WO | WO2008/147818 A1 | 12/2008 |
| WO | WO2009/026225 A1 | 2/2009 |
| WO | WO2010/080402 A1 | 7/2010 |
| WO | PCT201100108 A1 | 3/2011 |

\* cited by examiner

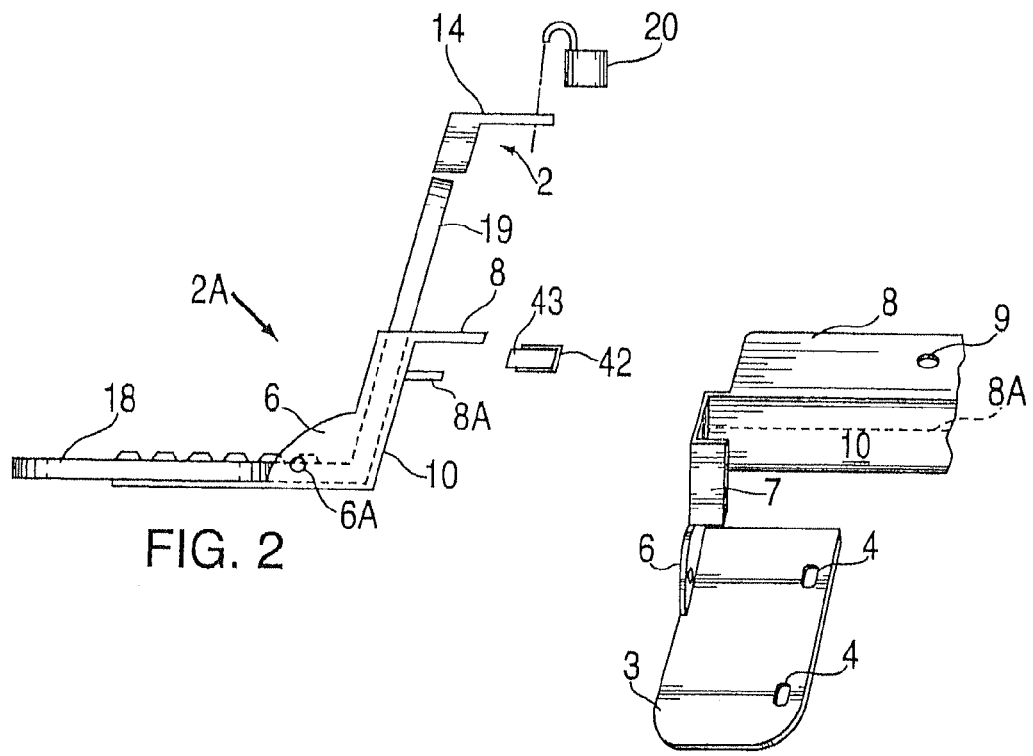
FIG. 2
FIG. 2A
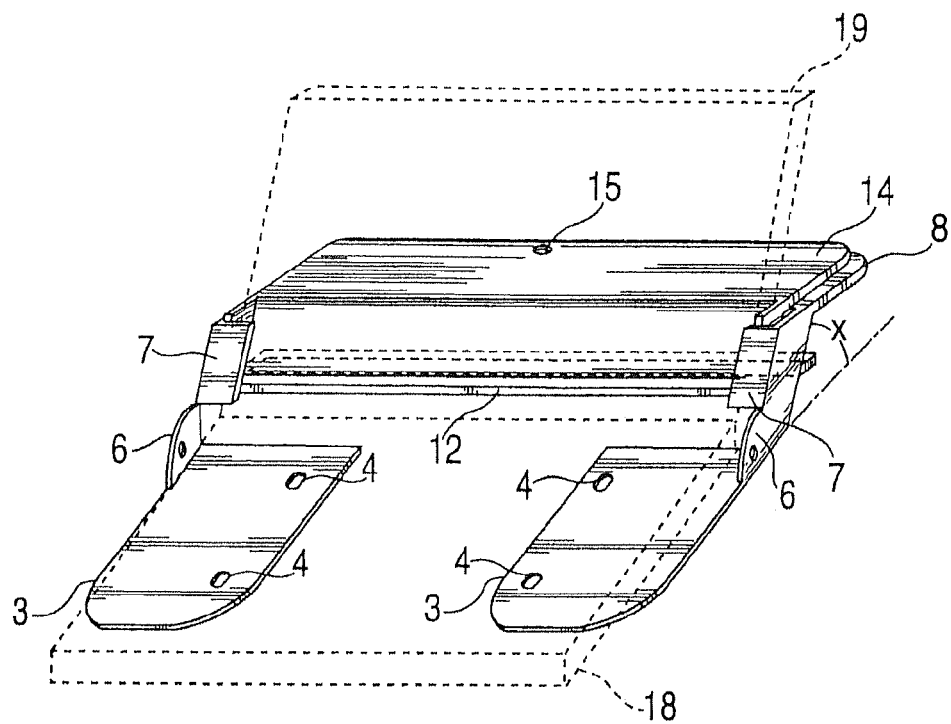
FIG. 2B

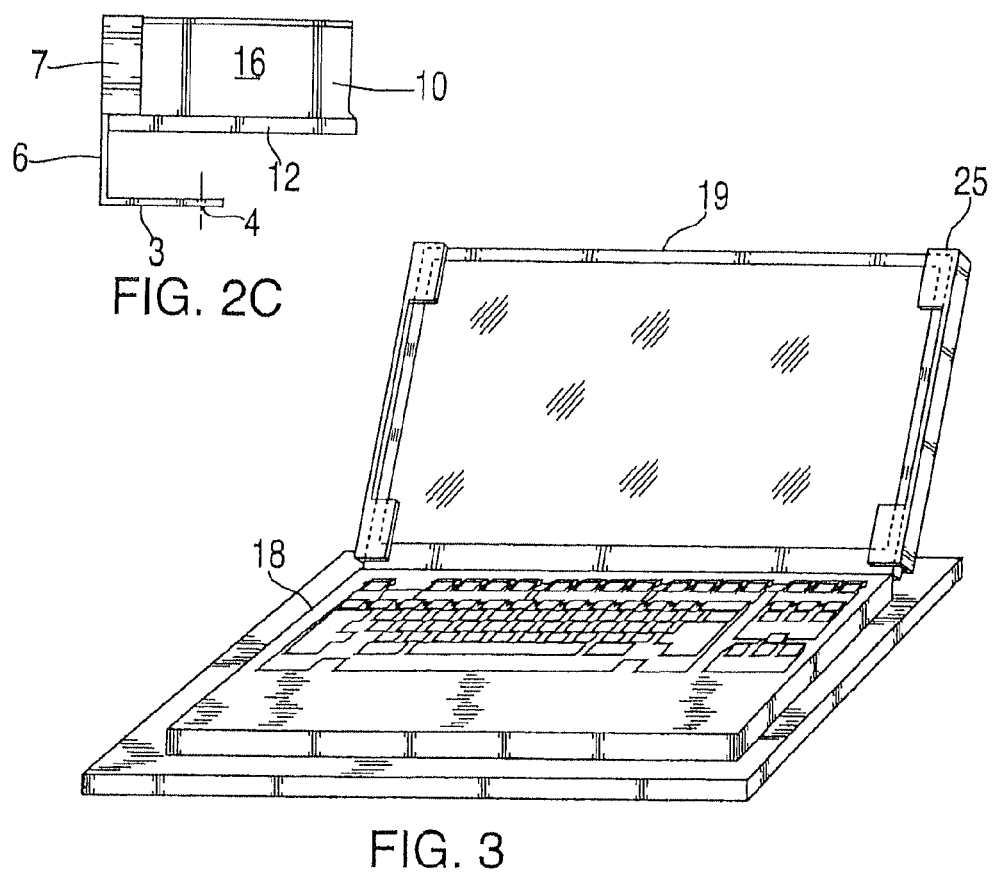

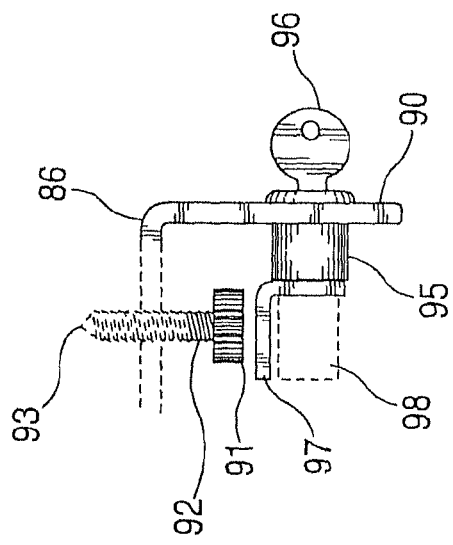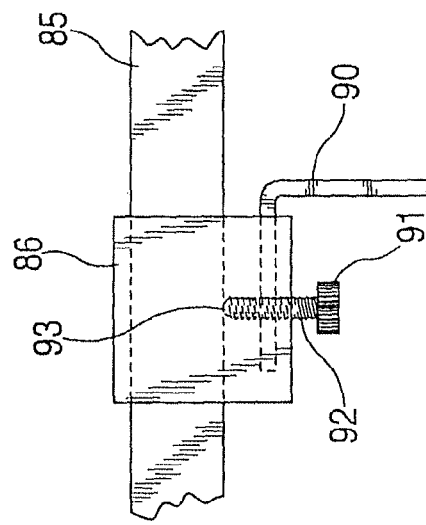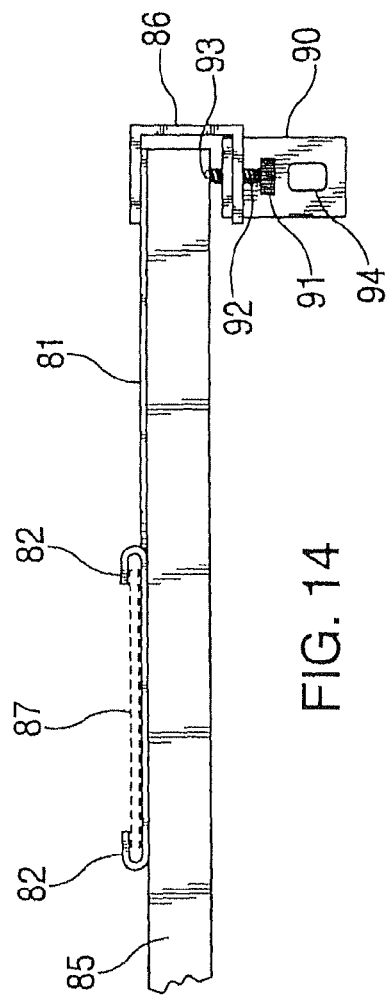

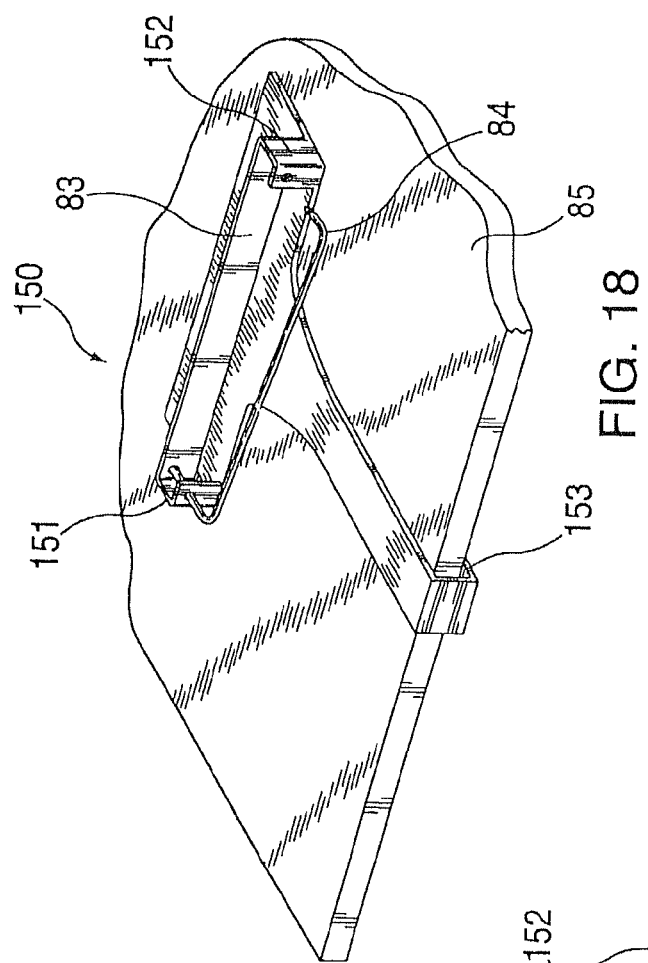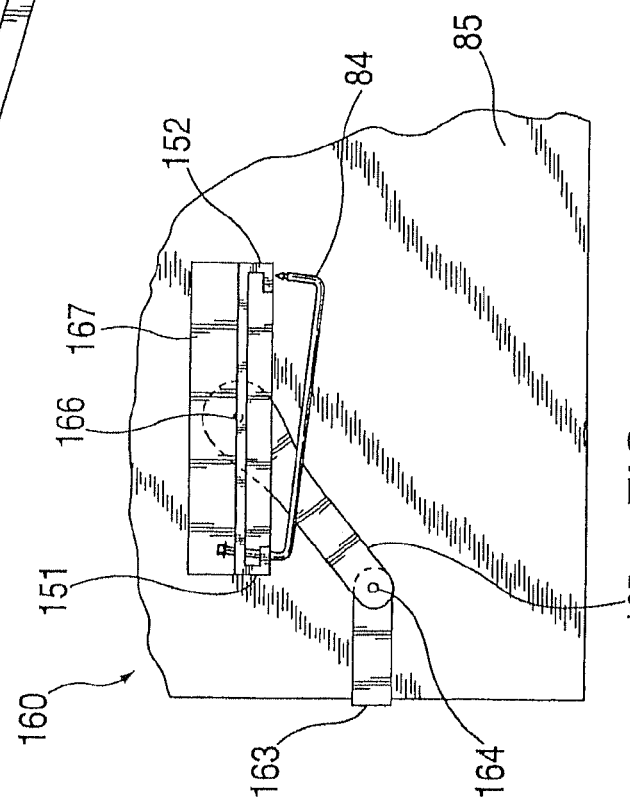

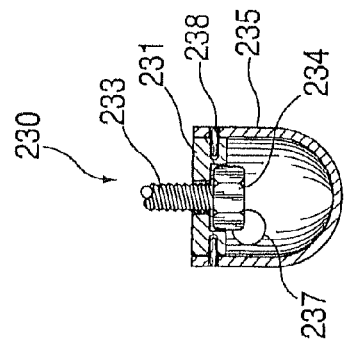
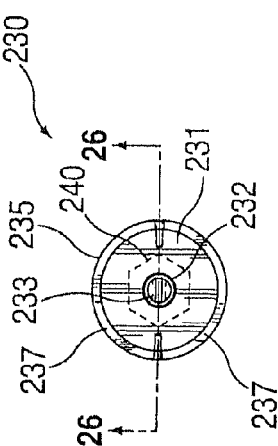
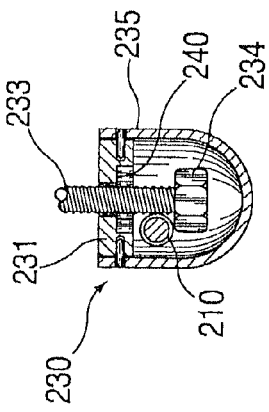
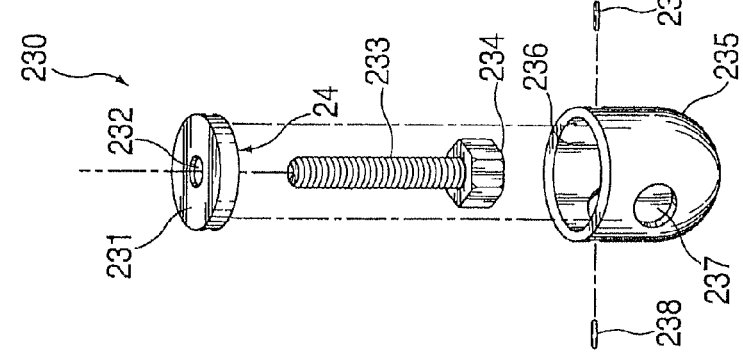
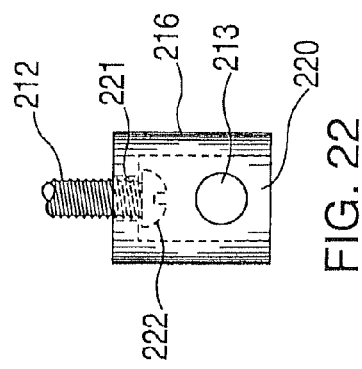
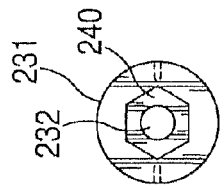

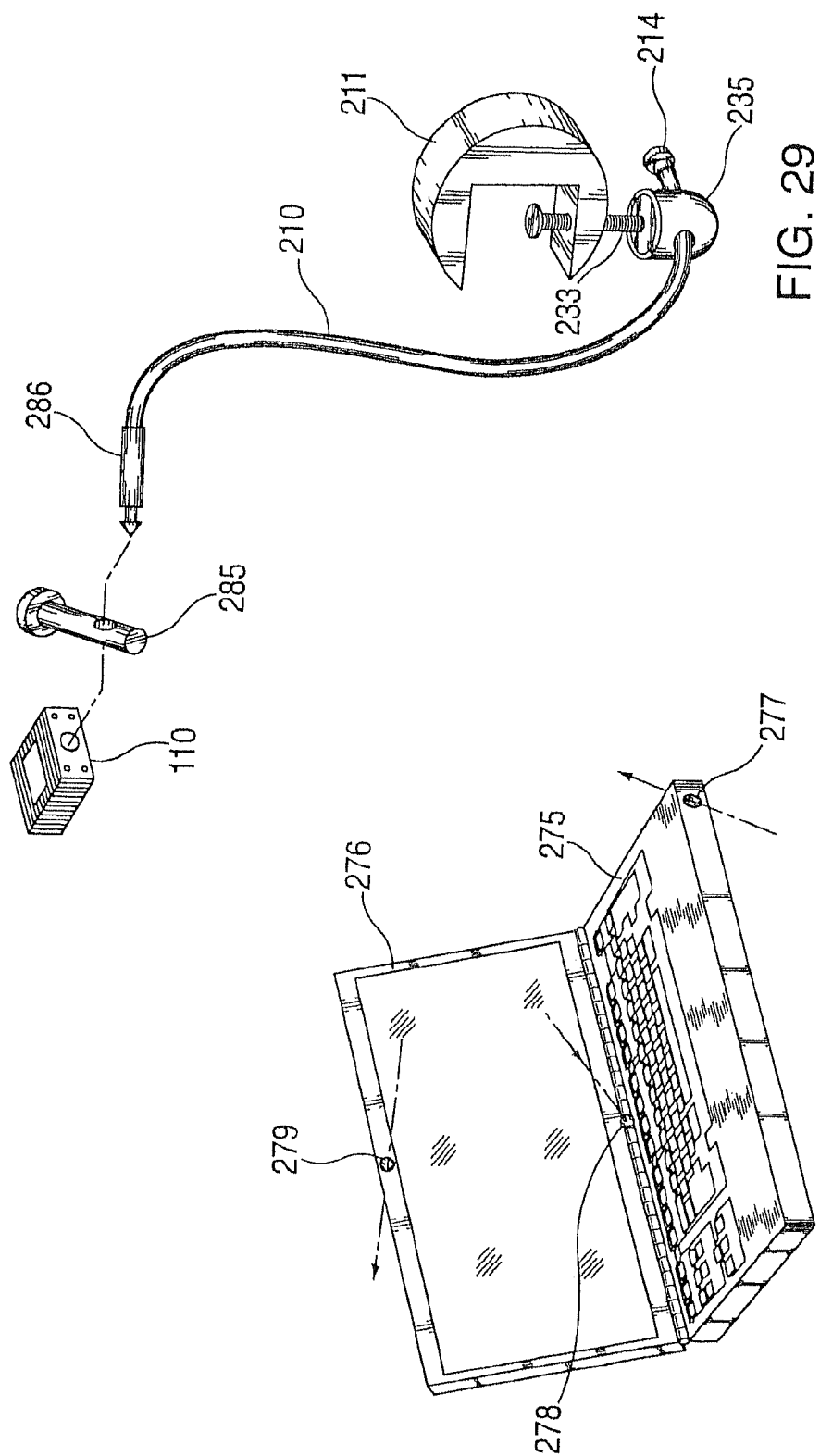

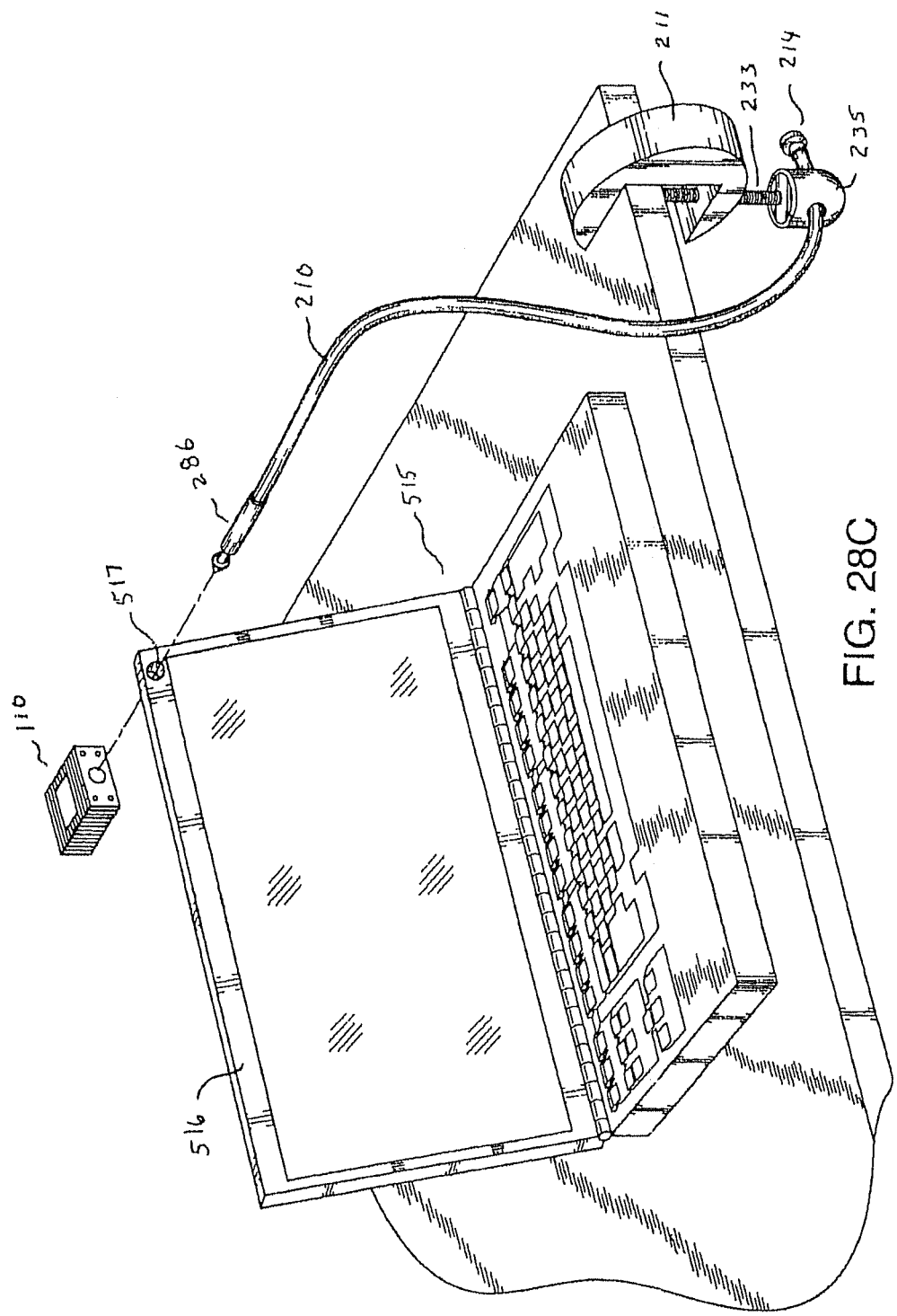

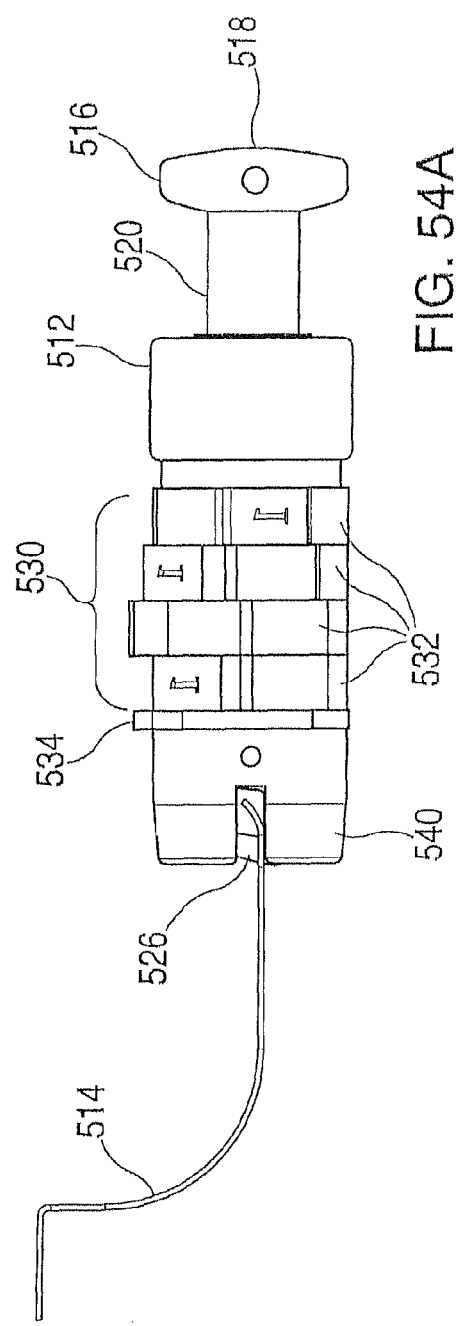
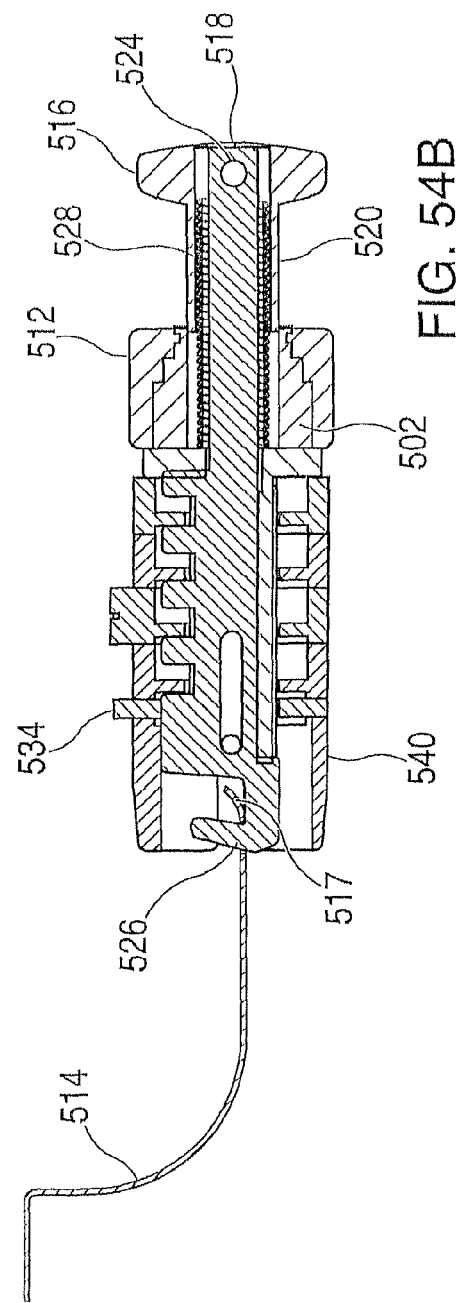

LOCKING ASSEMBLY FOR ELECTRONIC TABLET AND OTHER DEVICES

RELATED APPLICATIONS

This application is a continuation application of U.S. application Ser. No. 13/031,174, filed Feb. 18, 2011, which continuation application is a continuation-in-part ("CIP") of U.S. application Ser. No. 12/657,670, filed Jan. 25, 2010, which '670 application is a continuation-in-part (CIP) application of U.S. application Ser. No. 12/154,561, filed May 23, 2008 ('561 application), which '561 application is a CIP application of U.S. application Ser. No. 11/454,433, filed Jun. 16, 2006 ('433 application), which '433 application is a CIP application of U.S. application Ser. No. 11/359,871, filed Feb. 22, 2006 ('871 application), which '871 application is a CIP application that claims priority from a) U.S. Provisional Appln. No. 60/655,270, filed Feb. 22, 2005, b) Provisional Appln. No. 60/678,911, filed May 6, 2005 and c) U.S. application Ser. No. 11/038,591, filed Jan. 19, 2005 ('591 application), which '591 application claims priority from i) U.S. Appln. No. 60/569,561, filed May 10, 2004 and ii) Provisional Appln. No. 60/626,839, filed Nov. 10, 2004. The '433 application further claims priority from A) Provisional Appln. No. 60/691,476, filed Jun. 17, 2005, B) Provisional Appln. No. 60/725,333, filed Oct. 11, 2005, C) Provisional Appln. No. 60/757,737, filed Jan. 10, 2006, and D) Provisional Appln. No. 60/783,188, filed Mar. 16, 2006.

FIELD OF THE INVENTION

The present invention relates to a locking assembly for tablet computers (i.e. iPad®), smart phones, electronic books known as "ereaders", and other hand-held personal digital devices, as well as to plunger security locks, and to laptop computers, notebook computers and other hand-held electronic devices such as cell phones, personal digital assistants, personal music and/or video players (i.e. iPod®), etc., without limitation, which are configured for operational use with a locking assembly associated with such a plunger security lock.

BACKGROUND OF THE INVENTION

Notebook computers, tablet computers or other personal electronic devices are increasingly used by students at educational institutions. They are also used by workers at job sites. Notebook computers are often referred to as laptop computers, meaning a portable, foldable computer which can be used while positioned upon the user's lap. In some instances, "laptop computer" refers to the term used in the trade for an older version of a larger portable computer. However, with increasing streamlining and downsizing of portable computers, compact, smaller versions are referred to as "notebook computers", but the terms are generally interchangeable.

Personal electronic devices, such as tablet computers (i.e. iPad®), cell phones, smart phones, personal digital assistants, personal music and/or video players (i.e. iPod®), etc. without limitation, can be used just about anywhere. Other personal digital assistants, including electronic books, known as "ereaders", such as the Nook®, can download virtual images of books.

In order to safeguard the personal electronic device, such as a tablet computer, a notebook computer, smart phone, ereader or personal music and/or video player, it must be shut down, closed and transported by the user.

However, it is often advantageous for the user of a tablet computer, notebook computer or other personal electronic device to take a break and leave the device/computer open and operable at a work station, library study carrel, etc., with other papers and books left at their current open position. This leaves the personal electronic device, such as a tablet computer or notebook computer, vulnerable to theft.

Moreover, in the commercial retail environment, it is advantageous to display consumer electronic devices, such as tablet computers, notebook computers, cell phones or personal digital assistants in a secure but visually accessible display.

For that matter, various security devices are known for securing personal electronic devices configured for use with the known security devices.

For example, U.S. Pat. No. 6,755,056 (the '056 patent), discloses a security device (e.g., male lock fitting 100) for securing portable equipment having a security slot in the chassis of the equipment, and adaptor for adapting electronic portable equipment without a slot for use with the security device. The security device (100, 100') is tethered to a piece of heavy furniture or otherwise immovable structure, typically with a braided cable or like means, and includes an attachment with a slot mating head and an axial movable head locking member. This is inserted into the slot in the housing of the electronic equipment (or in the adaptor affixed to the housing where there is no slot) after the slot mating head to prevent rotation and removal of the head from the slot.

For example, the FIG. 7 security device (100') is inserted into a lock fitting receptacle 106 where pin 104 passes through the head locking aperture 25 into mounting end 22 and into slot opening 12. When fully inserted, the housing lockably engages the fitting by way of conventional locking mechanisms, such as fixed or retractable teeth 108, 108' on the male lock fitting and teeth engaging notches 110 within the receptacle, so the pin is secured in the head locking position.

One of the shortcomings of the '056 patent, however, is that the security provided is only as strong as either the housing material and therefore slot integrity, or the adhesive adhering the adaptor to the housing. A thin, sheet-metal housing is pliable and a plastic housing is frangible, allowing for easy removal of the attachment with slot mating head and axial movable head locking member, once in place.

U.S. Pat. No. 6,513,350 (the '350 patent), discloses a physical security system comprising a combination lock for connecting specially designed security slots in portable electronic devices, such as a notebook computer. Like the '056 patent, the security device of '350 patent operates with a portable computer with a wall 10 having an inner surface 20, which wall is configured with a slot 15. A lock interface 25 is engageable with wall 10 through slot 15. A locking mechanism 30 comprising a tethering cable and lock 40 allows that, upon inserting lock interface 25 in slot 15 and engaging the interface with inner surface 20, the lock interface is then attached to a stationary object with lock 40 and cable 40.

FIG. 6 shows an alternative locking system 600, including a housing 605 and slot engagement member 610 with locking member 615 and retaining member 620. Engagement member 610 is coupled to the housing 605 so that it moves between an extended and retracted position. Two pins 625 extend from the housing 605 and are located on opposing sides of a shaft of engagement member 610. The housing 605 includes a combination lock mechanism 630 for interacting with the engagement member 610 and retaining in the retracted position until the correct combination coed is dialed in to the lock mechanism.

Also like the '056 patent, however, the security provided by the '350 patent is only as strong as the housing material and therefore slot integrity. Moreover, and as is readily apparent in FIG. 6, there does not appear to be a means for effecting retraction and extension of pins 625 to/from housing 605, or means for comfortably grasping the lock mechanism to articulate slot engagement member in the slot 660 in wall 650 (FIG. 6).

OBJECTS AND SUMMARY OF THE INVENTION

It is therefore an object of the present invention to provide a locking assembly security apparatus for a non-foldable tablet computer, ereader or smart phone preferably associated with a plunger-type security lock or other locking device, and an electronic device configured to be secured in cooperation with the locking assembly and plunger-type security lock, which overcome the shortcomings of the prior art.

In one embodiment, the invention comprises a locking bar associated with a plunger-type or other security lock comprising a cradle including at least one diagonally extending chassis bar with respective pockets at opposite ends, wherein one of the pockets is hingeably releasable to insert one corner of the tablet computer, smart phone, ereader, or other hand held personal digital assistant device therein while the other end is a non-hingeable pocket into which the opposite corner of the tablet computer, smart phone, ereader or other hand held personal digital assistant is inserted therein. The hingeable pocket includes a hingeable housing which pivots to allow insertion of one corner of the device to be inserted therein, after the opposite corner has already been inserted in the slot of the fixed, non-hingeable pocket at the opposite side of the at least one chassis bar. The chassis bar is preferably adjustable in length, to allow for different sized devices to be locked therewith. Although there is preferably one diagonal chassis bar with opposite corner pockets to receive one of respective diagonally opposed corners of the device, it is contemplated that more than one chassis bar can be utilized, and/or comprise a frame with at least a pair of pockets each pocket supporting a respective corner of the device therein. One end of the chassis bar is configured as an axially extending flange with an aperture hole, which flange is insertable within a corresponding slot in lock having a movable pin or hook of a combination lock and locking mechanism in a housing.

For example, in a preferred embodiment, the security apparatus of this invention is designed to engage diagonal corners of an electronic tablet (such as an iPad®. The locking assembly apparatus engages with a tablet computer or similar device,which is securely locked to it via a combination pin lock, such as, for example, a plunger lock. A respective distal corner pocket engages one corner of the tablet computer, while a respective proximal lockable corner pocket engages the diagonally opposite corner of the tablet computer. The security apparatus includes a chassis bar, such as a flat metal chassis bar connecting the fixed distal pocket to the diagonally opposite proximal hingeable pocket.

The base of the proximal pocket extends from the attachment portion to the diagonally extending chassis bar to the flanges at the proximal end on the other side of the integral hinge pin housing of the proximal pocket, which flips up to permit a corner of the tablet computer or other device to be inserted or disengaged. The hingeable tail section of the flange fits between the forked flange protrusions of the base of the proximal hingeable pocket; when it is co-planar with the base and the slot of the pin lock can be fit over the end and locked by its pin engaging the hole within the hingeable tail section of the hingeable pocket, to complete the locking procedure.

Although a pre-determined sized security apparatus can be provided for the size most popular tablets or similar devices on the market, an adjustable single unit can also be provided as an alternate embodiment. In one embodiment, the adjustability feature is formed by permitting the metal chassis bar to slide through a slot in a modified distal pocket. An array of holes in the chassis provides the adjustability by virtue of a friction fit removable locking pin The pin cannot be taken out once the tablet computer is engaged, but it is simply lifted up for adjustment to permit the pocket to slide on the bar.

Another adjustable embodiment uses a two-part telescoping metal chassis bar This embodiment is more compact for smaller tablets or like items since there is no distal metal bar extending beyond the distal engagement pocket.

While any kind of plunger type pin lock having a slot and movable pin or hook can be utilized, in another embodiment a connector is provided connecting permanently connecting the locking housing to a tether, a plunger operational in cooperation with locking mechanism and a sliding key operate to lock the tether to a one end of a locking strip, which end extend part way through the electronic device. The other end of the locking strip comprises wedge stop, to prevent the locking strip from passing all the way through the housing, for example, a hinge gap between upper and lower housings.

The plunger-type security lock preferably operates by grasping the housing, dialing in a correct combination and pushing the plunger through the hole associated with one of the pockets. In another embodiment the plunger is pushed to extend the sliding key from a housing in order to engage a portion of the locking member. Once engaged, and upon release of the pushing force, the sliding key retracts the engaged portion of the locking member at least partially into the housing, and maintains it until the combination locking mechanism is unlocked.

In another embodiment, the invention comprises an electronic device configured for allowing a locking member to pass partially through, but not completely through some part of the electronic device chassis or housing, a locking member and a plunger-type security lock configured for lockingly engaging some part of the locking member once passed through the chassis or housing part.

Other objects which become apparent from the following description of the present invention.

When locked in place, the notebook computer or other personal electronic device is secure from being taken away from the surface to which it is locked. Furthermore, taking advantage of software and/or software/biometric security systems, the computer or other personal electronic device will also be unusable by unauthorized individuals when its owner is away from the area for a break, telephone call, or other short-term pursuits. With a few keystrokes, the owner of the computer or other personal electronic device can resume activity in exactly the same place as when activity had been suspended. This is especially useful for leaving an active computer or other personal electronic device on a study desk or library carrel.

In an alternative embodiment, the invention includes a method for securing a portable electronic device having a housing to a substantially immovable object utilizing a locking assembly having a security rod or spike formed with an anchoring end separated axially by a protruding end, a locking device with an internal locking mechanism and a cable permanently attached to the locking device at one end, includes several steps. The steps include securedly fixing the anchoring end of the security rod or spike to the portable electronic device upon or through the housing, attaching an other end of the cable to the substantially immovable object and inserting the protruding end of the security rod into an opening in the locking device to actuate the internal locking mechanism and lock the locking device to the captive security rod. Locking the security rod to the locking device concurrently locks the portable electronic device to which it is anchored to the substantially immovable object.

In yet another alternative embodiment, the invention includes a locking assembly for securing a portable electronic device having at least one housing to a substantially immovable object. The locking assembly includes a captive security rod having a locking end and an anchoring end, wherein the anchoring end is passed through the at least one housing to anchor the captive security rod thereto and a locking device with a locking mechanism, wherein the locking device is configured to receive the locking end of the captive security rod to activate the locking mechanism and thereby lock the security rod and portable electronic device to the locking device.

The locking assembly also includes means for securing the locking device and, therefore, the captive security rod and portable electronic device to which the captive security rod is anchored, to a substantially non-movable object, e.g., a cable or lanyard, preferably permanently attached to the locking device. The locking end of the captive security rod comprises a knob that extends from the at least one housing after the anchoring end anchors the captive security rod thereto. Preferably, the small knob that is captured and held by the locking mechanism at locking actuation.

The captive security rod, upon anchoring to the at least one housing of the portable electronic device, is stored in a recess and grasped to deploy in an extended position. The locking end of the captive security rod operates to collapse into the at least one housing during non-use. The portable electronic device may be any of the group consisting of a laptop computer, a notebook computer, and tablet computer, a cell phone, a camera, a Smartphone, a music storage and a playback device, without limitation. For that matter, the portable electronic device preferably comprises a first housing, a second housing and a hinge, wherein said hinge separates and allows said first housing to he closed upon said second housing and wherein said captive security rod is deployed to extend and protrude from any surface of said first housing or said second housing.

In addition, and in one form, the second housing is a keyboard part and said captive security rod is inserted through and anchored, and operates to extend in a deployed position out of a surface of said second housing. The substantially immovable object may comprise a base plate and the locking device may comprise a pin lock, a plunger-type security lock, or other known lock, without limitations.

In yet another embodiment, the invention provides a locking assembly for securing a portable electronic device having a housing to a substantially immovable object. The locking assembly comprises a security rod or spike, a cable and a locking device.

The security rod or spike has a protruding end, an anchoring end opposite the protruding end and a transverse hole positioned between the protruding end the anchoring end, wherein the anchoring end is configured for passing through an opening in the housing to anchor the security rod to the portable electronic device while leaving the transverse hole exposed. The cable has a first end and a second end, wherein the second end is configured for secure fastening to the substantially immovable object. The locking device is configured with an opening for receiving the first end of the cable after it is passed through the transverse hole of the security rod or spike.

An actuating mechanism in the locking device captures the first end of the cable to lock security rod and spike and, therefore, the portable electronic device to the which the security rod is anchored, to the substantially immovable object. The first end of the cable is formed as a ferrule configured with a locking groove, and wherein the actuating mechanism captures the ferrule groove upon insertion of the first end of the cable into the lock device to actuate the locking mechanism.

After anchoring to the housing, the portion of the security rod or spike including the transverse hole and protruding end is always exposed.

The portable electronic device comprises a first housing, a second housing and a hinge, wherein said hinge separates and allows said first housing to he closed upon said second housing after the security rod is anchored to either the first or the second housing. The second housing is a keyboard part and said captive security rod is fixedly inserted through a surface of said second housing.

BRIEF DESCRIPTION OF THE DRAWINGS

The present invention can best be understood in connection with the accompanying drawings. It is noted that the invention is not limited to the precise embodiments shown in drawings, in which:

FIG. 2 is a side view of the embodiment of FIG. 1, taken along in the direction of arrow "2" of FIG. 1, showing a typical notebook computer locked with a locking base and locking collar to a work surface with a padlock;

FIG. 2A is a partial fragmentary view of the locking base as in FIG. 2, taken along in the direction of arrow "2A" of FIG. 2;

FIG. 2B is a partial perspective view of the typical notebook computer locked in place between the locking base and locking collar of FIG. 2;

FIG. 2C is a partial front elevational view of the locking base and locking collar as in FIG. 2;

FIG. 3 is a perspective view of an alternate embodiment showing a typical notebook computer in the locking base with an elongated back side;

FIG. 13A is a front elevation of a clamp detail of the locking base shown in FIG. 13, taken along the ellipse 13A of FIG. 13;

FIG. 13B is a clamp bracket side elevational view thereof, showing use of a key lock;

FIG. 14 is a side edge view of the locking base of FIG. 13, shown attached to a work surface;

FIG. 18 is a perspective view of an integrated locking base/computer lock embodiment;

FIG. 19 is a top plan view of another integrated locking base/computer lock with two pivot links;

FIG. 22 is a detail side view of the clamp screw subassembly used in FIG. 21, shown in the ellipse "22" of FIG. 21;

FIG. 23 is an exploded perspective view of the components of an alternate embodiment with a socket wrench type clamp screw subassembly;

FIG. 24 is a bottom view of the end cap of the embodiment of FIG. 23, showing the recess which forms the socket wrench element;

FIG. 25 is a top view of the clamp screw assembly as in FIG. 23, shown with the captive screw;

FIG. 26 is a side view cross-section of the clamp screw assembly as in FIG. 23, taken along line "26-26" of FIG. 25, shown with the screw head seated in the socket wrench recess and preventing insertion of the cable;

FIG. 27 is a side view in cross-section of the clamp screw assembly as in FIG. 23, shown with the cable preventing seating of the screw head in the socket wrench recess.

FIG. 28 is a perspective view showing the possible locations of through-holes for use of an alternate protrusion spike embodiment security feature used with a cable;

FIG. 28C is a perspective view of the computer of FIG. 28B with a pin lock and locking ferrule aligned prior to insertion through security hole.

FIG. 29 is a perspective view of the spike with a cable attached ferrule, pin lock, and secure cable clamp used to secure a notebook computer;

FIG. 54A is a plan view of the plunger-type security lock of FIG. 53, seen along A-A therein;

FIG. 54B is a cut away view of the plan view of the plunger-type security lock as shown in FIG. 54A;

DETAILED DESCRIPTION OF THE INVENTION

Figure 1:
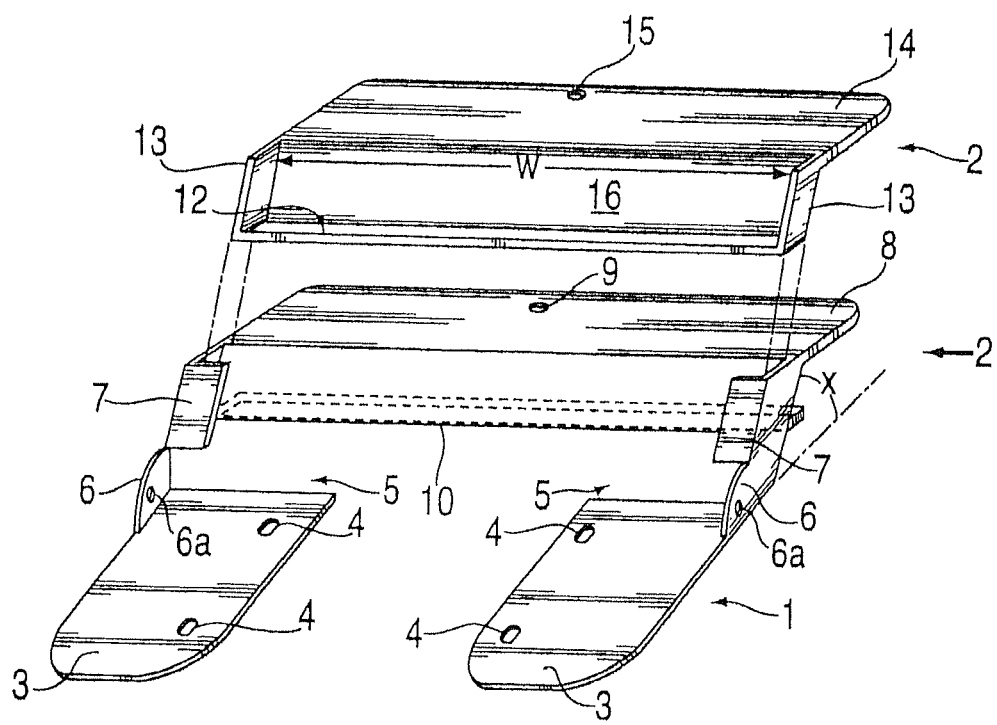
FIG. 1 is a perspective view of a locking base and locking collar of one of the embodiments for a notebook computer lock of this invention.

FIG. 1 shows locking base 1 for a notebook computer lock, which is secured to a working surface by fastener holes, such as screw through holes 4 in base mounting pads 3. A back surface 10 is tilted at angle "X" to provide a good viewing angle of the computer screen. Side panel members 6 with bent tabs 7 provide a space for sliding locking collar 2. Locking flange 8 with a locking hole, such as padlock hole 9, is used to secure locking collar 2 with flange 14 via hole 15, which is in positional registration with hole 9 when mated. Width "W" is wider than the widest notebook computer or other personal electronic device to be accommodated by this locking base system. Locking bar 12, attached to the distal ends of sides 13, actually secures the notebook computer or other personal electronic device. This is the preferred embodiment. The display screen portion rests within space 16 between sides 13. In use, the keyboard portion of a notebook computer or other personal electronic device would deny access to the fasteners, such as retaining screws, in holes 4.

Side panel members 6 may have one or more ports 6a to accommodate computer cables therethrough.

FIGS. 2, 2A, 2B and 2C show how locking collar 2 is placed over notebook computer screen 19 and then upon flange 14, and is locked to lower flange 8 via a lock, such as padlock 20. Keyboard 18 fits between sides 6. Space 5 is created by a raised back panel 10 so as to permit access to a variety of connectors at the back of computer keyboard portion 18. FIG. 2 also shows an optional compartment 42 for a power source accessory 43, such as an auxiliary battery charger or battery eliminator, wherein compartment 42 extends between power flange 8 and further lower flange 8A.

Figure 2D:
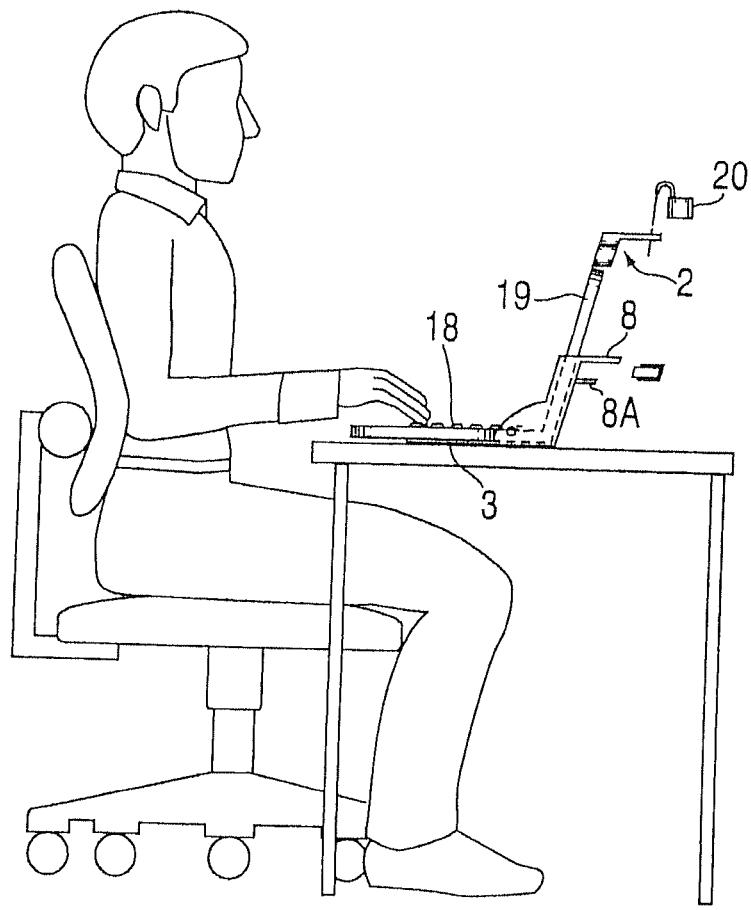
FIG. 2D is a side elevational view of the notebook computer shown used by a person at a work station.
Figure 3A:
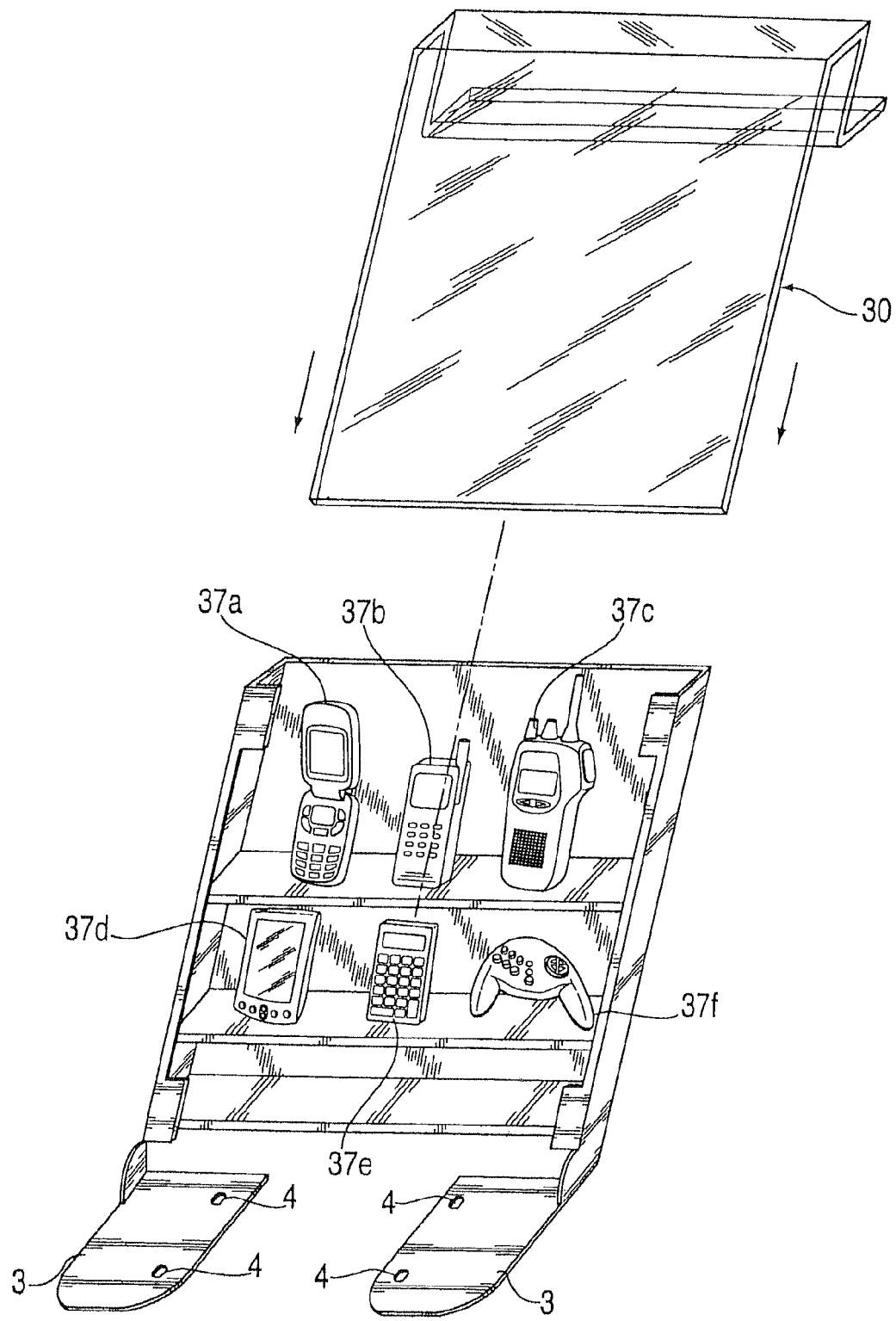
FIG. 3A is an exploded perspective view of a further embodiment, showing handheld electronic accessories displayed upon respective shelves, added to the front side of the locking base of FIG. 3.
Figure 3B:
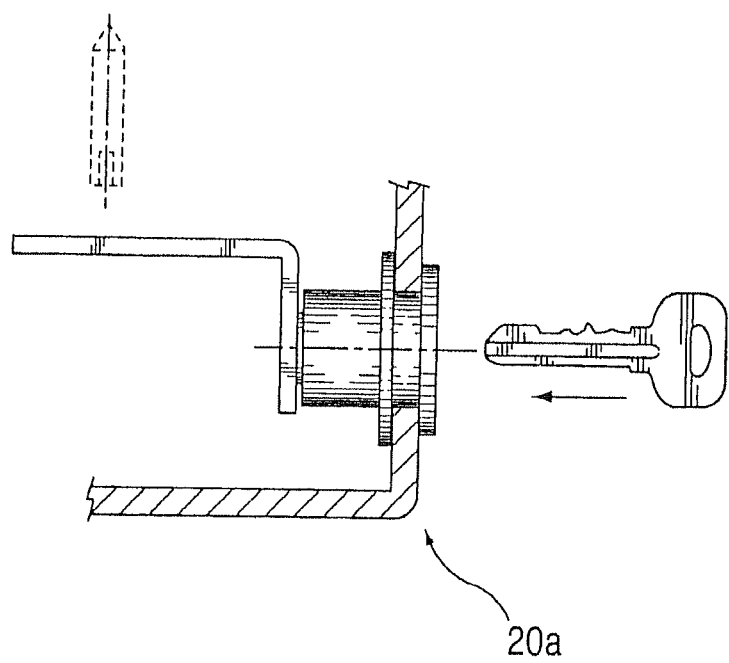
FIG. 3B is a close-up of one type of key lock used with the notebook computer lock of the present invention.
Figure 4:
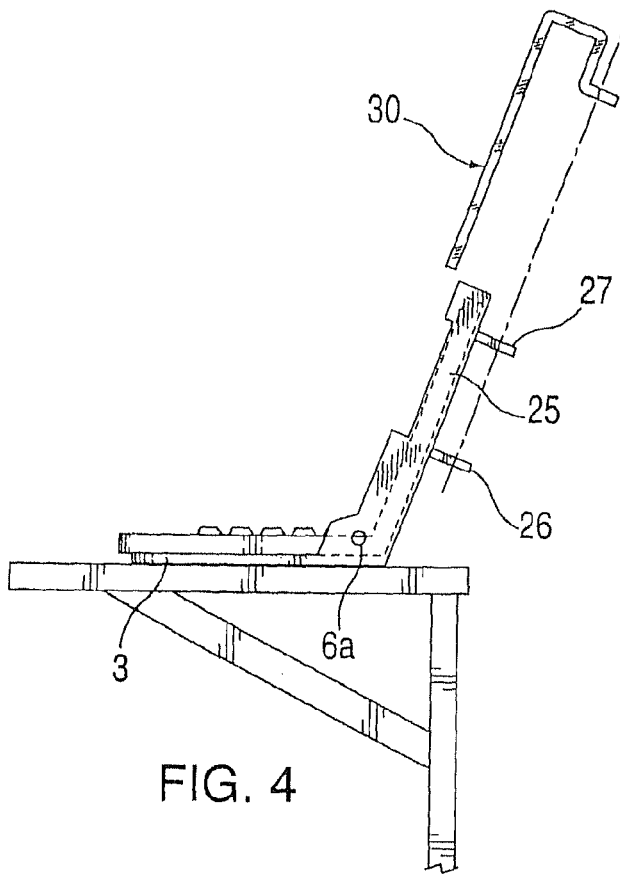
FIG. 4 is a side view of alternate embodiment for a notebook computer lock of FIG. 3, showing dual locking flanges.
Figure 6:
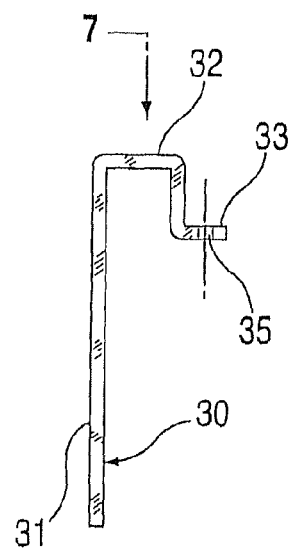
FIG. 6 is a side edge view of the transparent locking panel showing a locking flange, taken along in the direction of arrow "6" of FIG. 5.

FIG. 2D shows the notebook computer being used by a person at a work station;

In an alternate embodiment shown in FIG. 3, upright portion 25 supports the entire height of screen 19 above raised back panel 10 mounted upon base pads 3. This can also be shown in FIG. 4. FIG. 3B shows another example of a lock 20a, which can be used in lieu of padlock 20.

FIG. 3A shows a further alternate embodiment where shelves 36 and 36a are depicted supporting electronic handheld devices such as folding cell phone 37a, upright cell phone 37b, marine VHF radio 37c, personal digital assistant 37d, calculator 37e and video game pad controller 37f.

Figure 5:
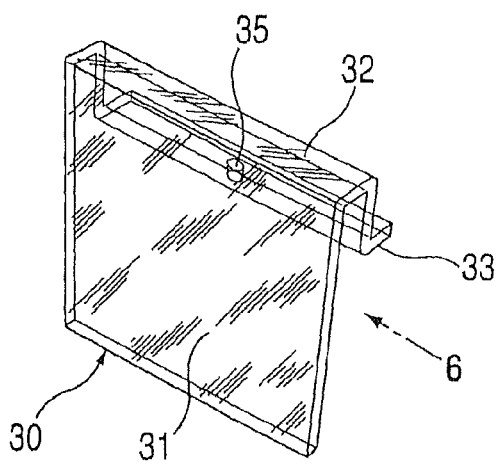
FIG. 5 is a perspective view of a transparent locking panel of the alternate embodiment shown in FIG. 4.
Figure 7:
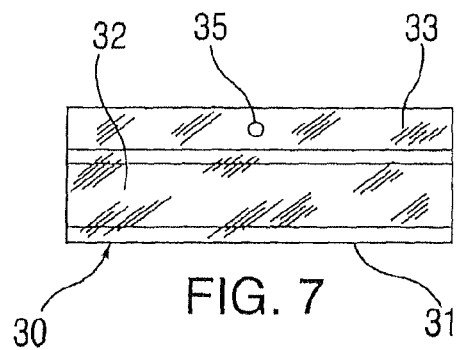
FIG. 7 is a top plan view of the transparent locking panel showing a padlock hole in the locking flange, taken along in the direction of arrow "7" of FIG. 6.

A transparent panel, such as LEXAN® polycarbonate panel 30, shown in FIG. 5, is used as a locking frame, by sliding it over screen 19 within the four tabs shown in FIG. 3 at the distal corners of upright 25.

Panel 30, shown in FIGS. 4-7, has a top portion 32 and a locking flange 33 with padlock hole 35. In use, this hole is in positional registration with that of upper locking flange 27 shown in FIG. 4. A padlock 20 or other small lock 20a can be used to secure the two members together. Front face 31 of transparent panel 30 protects the surface of computer screen 19. This can be used to advantage in a retail demo environment. Alternately, the locking collar of FIG. 1 can be used with base of FIG. 3 by locking into lower locking tab 26; this would offer a better unencumbered view of screen 19.

Figure 8:
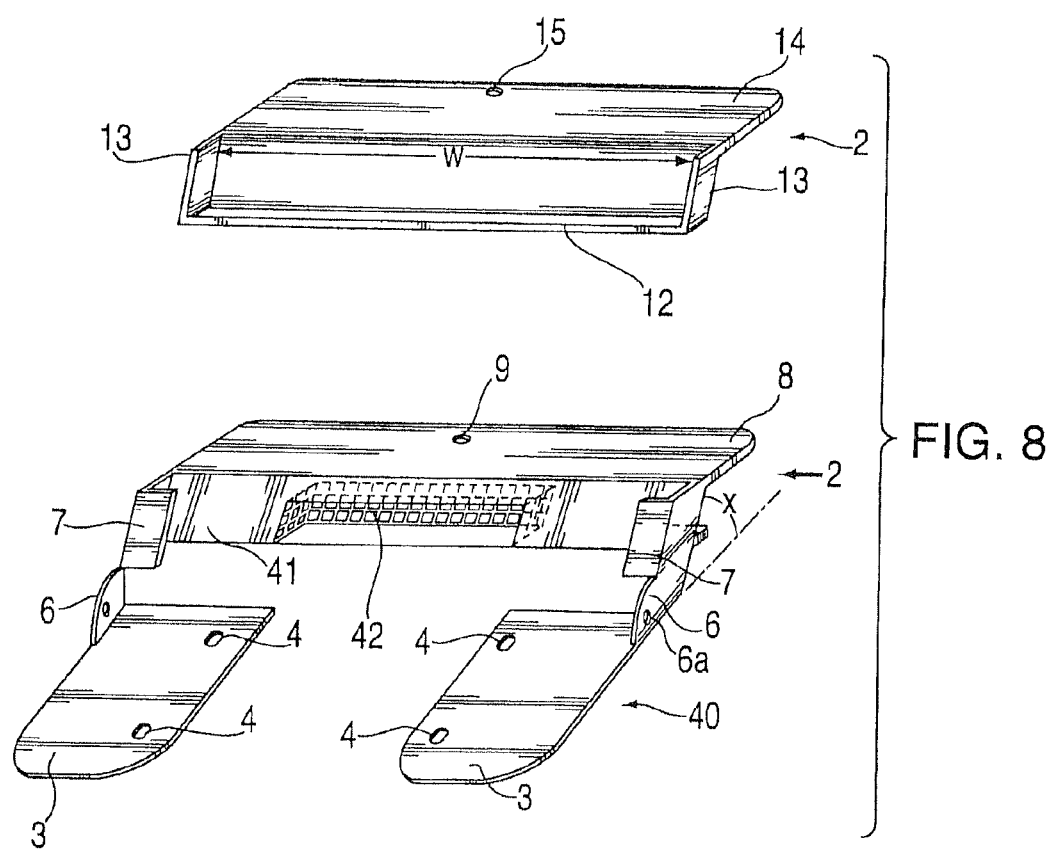
FIG. 8 is an exploded perspective view showing the addition of an optional battery pack housing cage feature to the locking apparatus of the embodiment shown in FIG. 1, although it can be used with any of the embodiments herein.

FIG. 8 shows the addition of an optional battery pack housing cage 42 feature to the locking apparatus of the embodiment shown in FIG. 1, although it can be used with any of the embodiments herein;

The optional power source component 42 of FIGS. 2 and 8 can be added to any of the embodiments of this invention, including those shown in FIGS. 3-51. It is preferably a cage made of heavy duty wire screen or perforated metal that is attached (as by welding or rivets) to a rear panel, such as panel 41 in FIG. 8. This provides a secure compartment 42 for a power source accessory 43, such as an auxiliary battery, charger, or battery eliminator.

Figure 9:
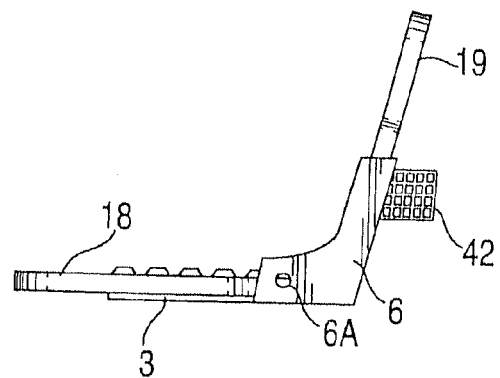
FIG. 9 is a side view of the locking apparatus of FIG. 8 used on a notebook computer showing the housing cage feature.

Compartment 42 is also shown in the side view of FIG. 9.

Figure 10:
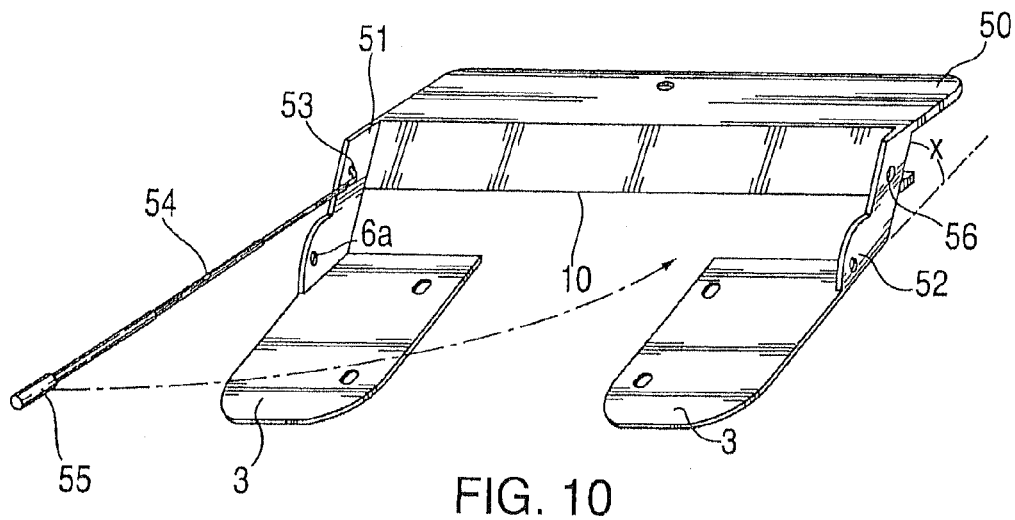
FIG. 10 is a perspective view of a further alternate swing arm embodiment using a swinging arm, such as a telescoping bar, to secure a typical notebook computer.

In a further alternate embodiment, shown in FIG. 10, a locking base using a telescoping rod 54 is shown. In this embodiment, there is no member such as locking collar 2 or transparent panel 30 that can be readily removed from the locking base when a computer or other personal electronic device is not secured to the base. This should reduce the incidence of vandalism or theft of the removable item which would render the base unusable. In FIG. 10, one end of bar 54 is attached to the left side panel member 51 of base 50 via a pivotable fastener, such as ball joint 53. After the notebook computer or other personal electronic device is inserted between sides 51 and 52, bar 54 is swung over the lower (hinge) portion of the notebook computer's screen, such as a liquid crystal display (LCD) screen and is elongated so as to insert lock plug 55 through locking hole 56 in right side 52. A lock (not shown), such as padlock 20, is then inserted through the hole in plug 55 thus locking computer to base.

Figure 11:
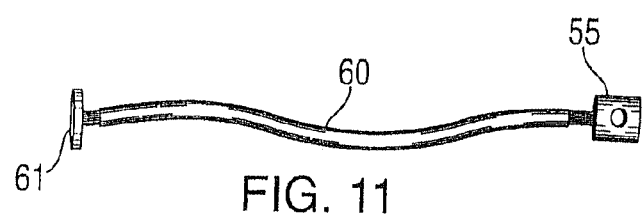
FIG. 11 is a top plan view of a clad steel cable used as a locking element for the further alternate swinging arm embodiment.
Figure 12:
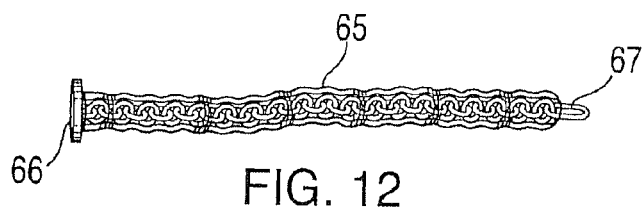
FIG. 12 is a top plan view of a chain inside a flexible tube as an alternate locking element in the embodiment of FIG. 10.

Alternate locking members include locking members such as vinyl clad steel cable 60 shown in FIG. 11, and the flexible tubing clad chain 65 shown in FIG. 12. These two devices do not require a ball joint attachment to left flange 51. Cable 60 can be simply inserted through a hole in flange 51 and then retaining washer 61 can be permanently attached as by spot welding. Lock plug 55, used as for telescoping rod, is attached to the distal end of cable 60. Chain 65 can be attached to flange 51 in a similar fashion by attaching washer 66 to its proximal end after threading through a hole. The distal end of chain 65 has an elongated link 67 with stop washer attached. The padlock is engaged through this link after it emerges through hole 56 in side 52.

Figure 13:
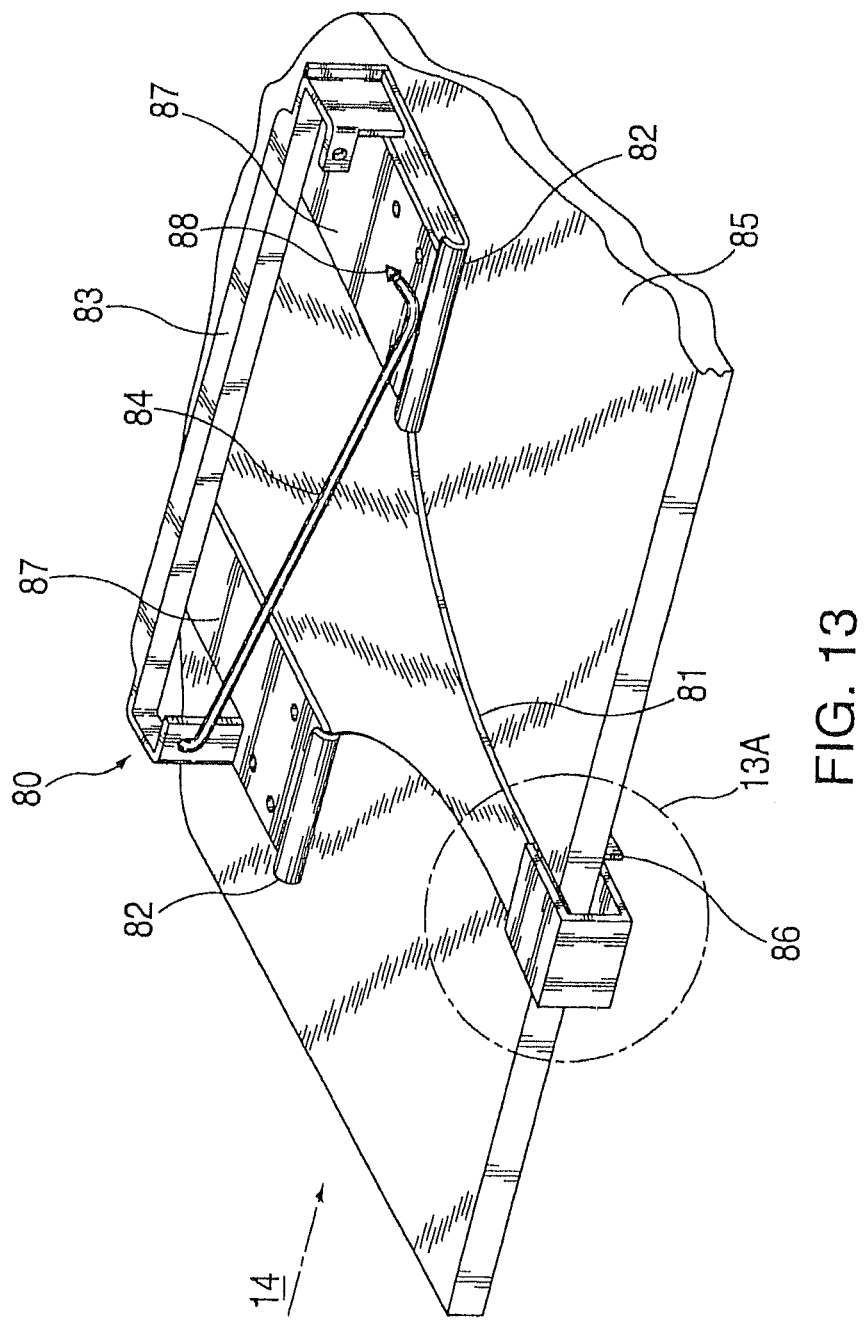
FIG. 13 is a perspective view of an alternate embodiment of a notebook computer lock using a separate "over the table" locking base and a computer lock using a captive swinging locking bar, which fits across lower portion of the display.

FIG. 13 shows an alternate embodiment using a separate locking base 81 used with a notebook computer or other personal electronic device lock 80 which slides in from the left so that one or more base pads 87 are retained by one or more brackets 82 on base 81. FIGS. 13 and 14 also show a clamp 86 which secures the lock in place by clamping the lock over a working surface, such as a table top 85.

A better view of this is the side edge view of FIG. 14. Clamp 86 slips over the edge of work surface 85. Locking bar 84 is captive in left bracket of computer or other personal electronic device lock 80, but it can swing out to permit access of computer or other personal electronic device display. The distal end 88 is grooved to accommodate a key lock to secure the computer or other personal electronic device as well as lock 80 to base 81. The long neck portion of base 81 from clamp 86 to brackets 82 positions the computer or other personal electronic device at a convenient distance from the front edge of table working surface 85. The detail of clamp 86 in FIG. 13A shows how screw 92 with optional security head 91 is screwed into the bottom surface of table working surface 85 via pointed end 93.

FIG. 13B shows how tang 97 prevents screw 91 from being loosened when lock 95 is locked via key 96. Lock 95 can be easily removed from hole 94 in lock bracket 90. When tang 97 is turned to position 98, screw head 91 is not obstructed so that it can be removed or tightened.

Figure 15:
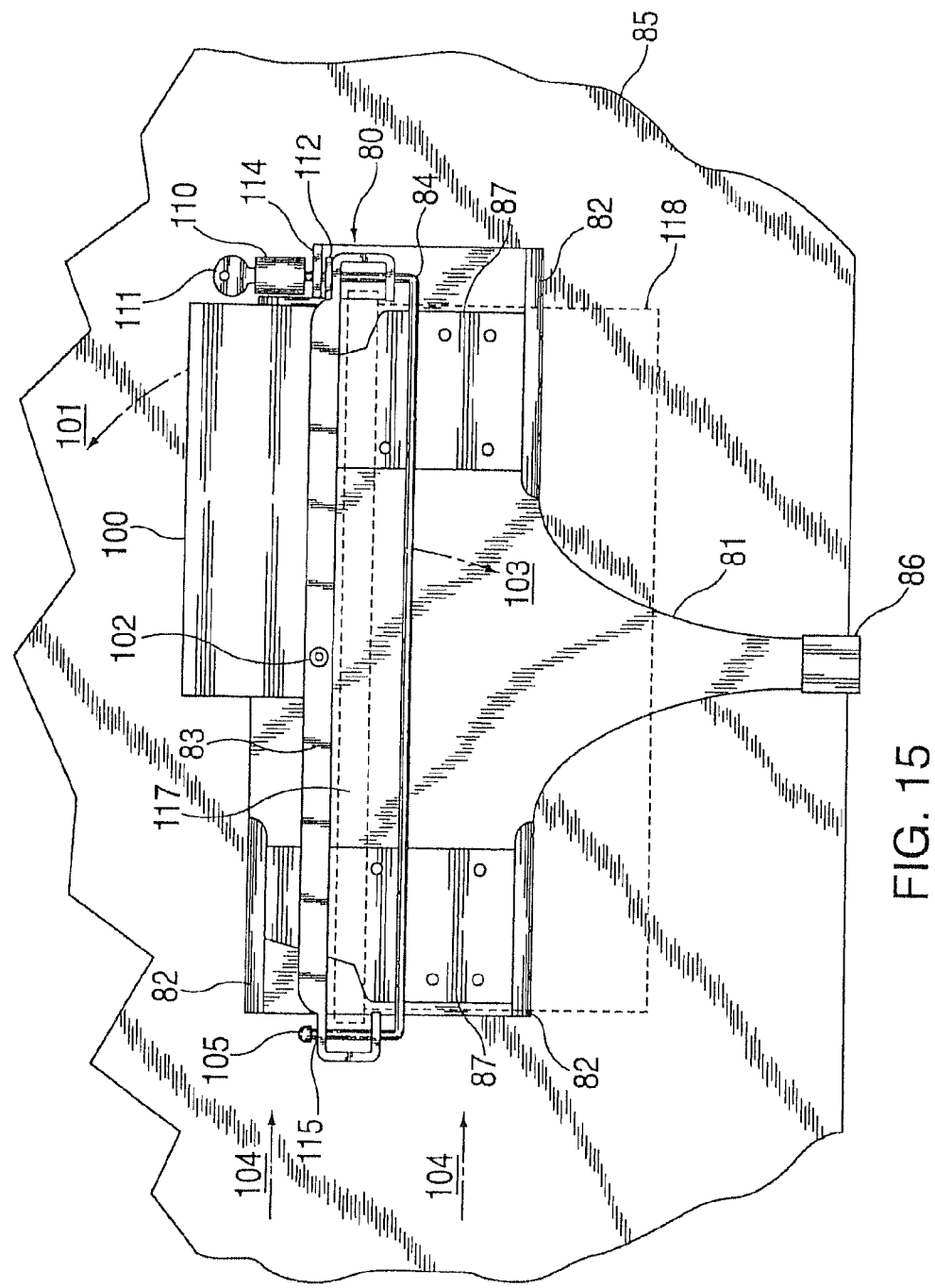
FIG. 15 is a top plan view of the computer lock of FIG. 13, secured within a locking base, also showing the position of the notebook computer with dashed lines.

FIG. 15 is a top plan view showing details of notebook computer or other personal electronic device lock 80 locked to base 81 with a computer or other personal electronic device display shown in dashed lines in position 117 and keyboard shown in dashed lines in position 118. Power supply box 100 can pivot open in the direction of arrow 101 on shaft 102 with a retaining cap; it is locked via tang 112. Notebook computer or other personal electronic device lock 80 is slid into a captive position within brackets 82 retaining the edges of base plates 87 in the direction of arrow 104. The left end of swinging locking bar 84 (which can swing out in the direction of arrow 103) is retained via retaining cap 105 within slotted hole 115 and an oversize hole on front of the left bracket. Key lock 110 grasps rod end 88 of swinging locking bar 84, which maintains the security of the assemblage via bracket tang 114, which is part of locking base 81. Key 111 can be used to remove the lock body from the end of swinging locking bar 84.

While FIG. 13-15 shows a separate over the table locking base 81 used with a notebook computer or other personal electronic device lock 80 which slides in from the left so that base pads 87 are retained by brackets 82 on base 81 of notebook computer or other personal electronic device lock 80, it is contemplated that a further alternate embodiment includes attaching notebook computer or other personal electronic device lock 80 directly to a work surface 85, such as a study desk, by providing fastener receptacles within base pads 87, wherein fasteners, such as screws or bolts fasten base 81 directly to an upper side of the work surface 85, without the use of over the table base 81.

Figure 16:
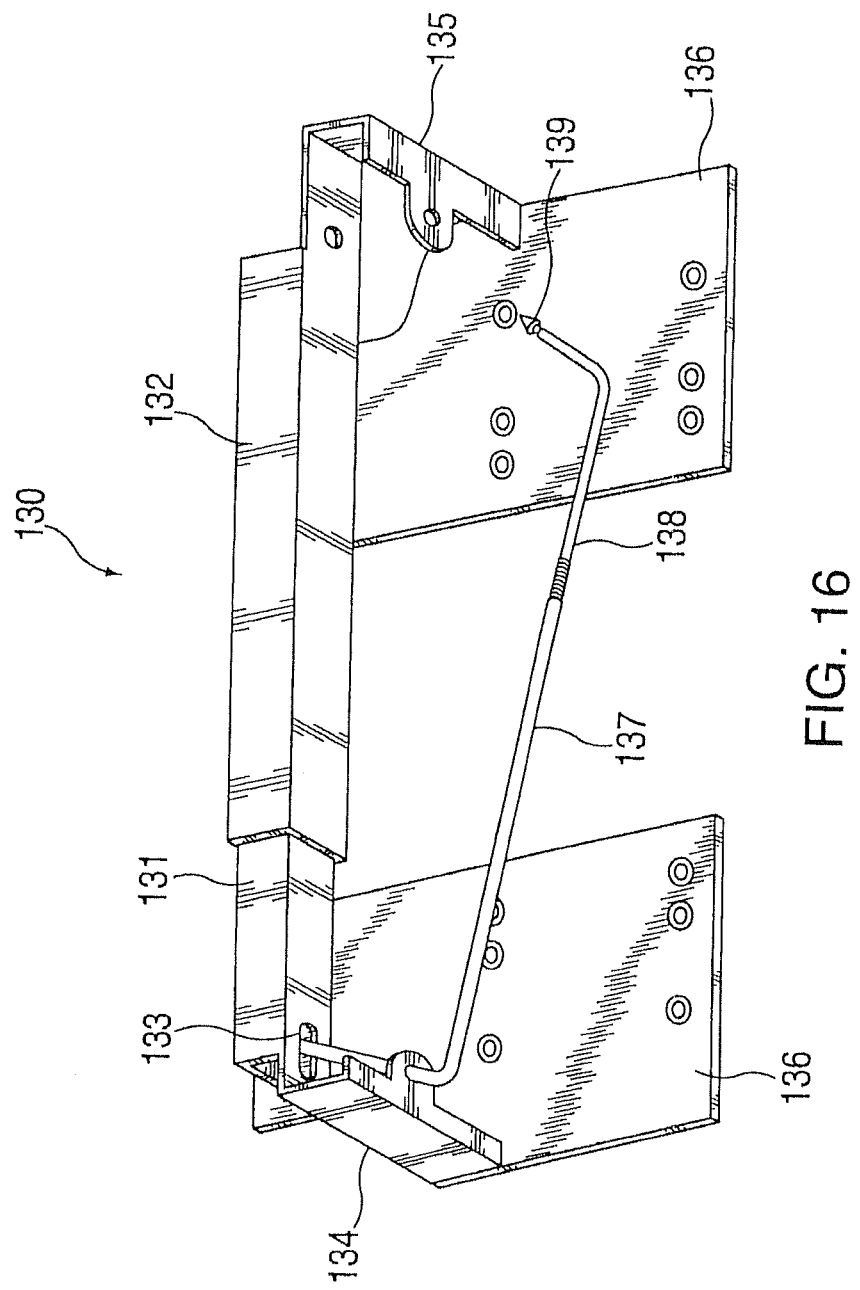
FIG. 16 is a perspective view of one embodiment for a width adjustable notebook computer lock.

FIG. 16 shows another embodiment of a notebook computer or other personal electronic device lock 130 with a telescoping width adjusting feature to accommodate computer or other personal electronic devices of varying widths more securely. Base pads 136 are compatible with the use of locking base 81 of the previous embodiment to retain this continuous adjustment feature. Locking bar portions 137 and 138 are adjustable in size.

Figure 17:
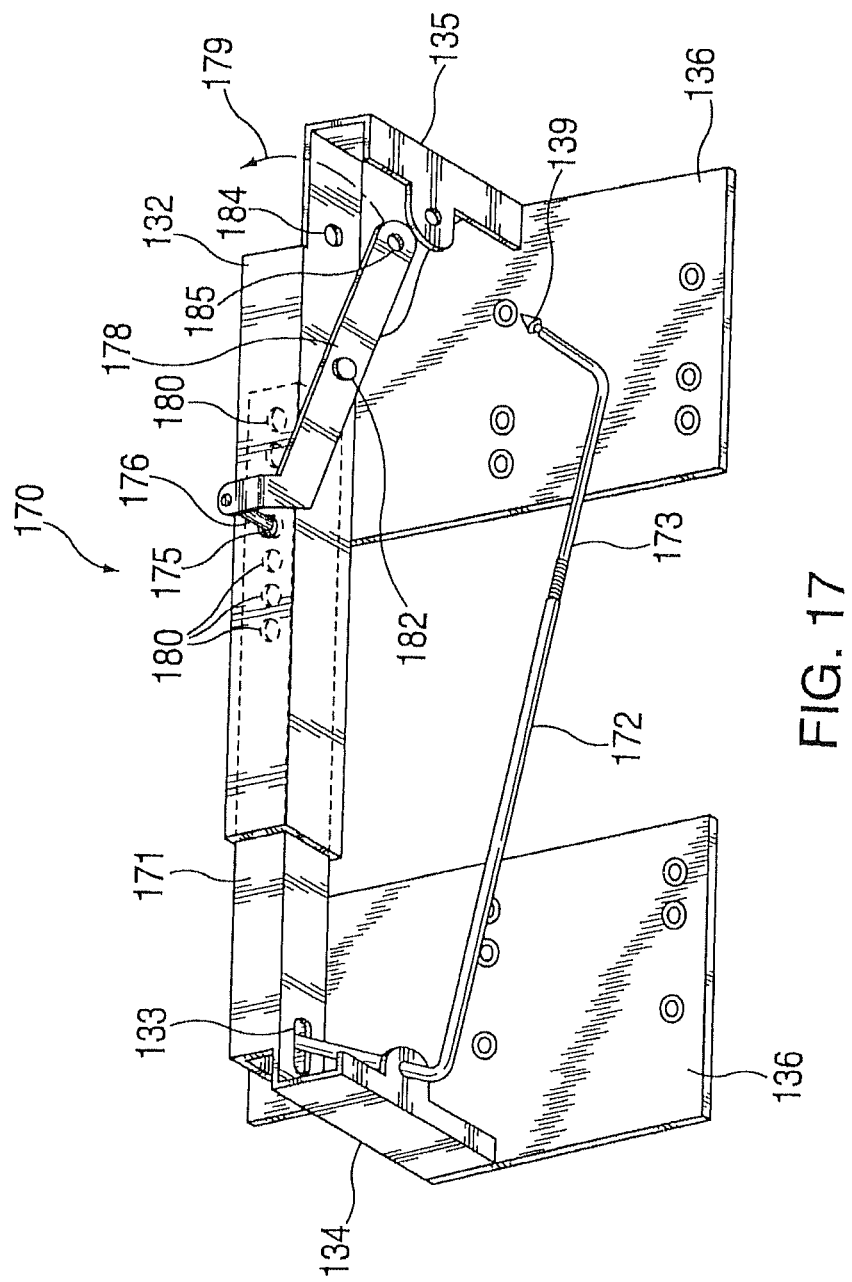
FIG. 17 is a perspective view of a further embodiment for a discrete width adjustable notebook computer lock.

For example, as in FIG. 17, incrementally spaced detents or pins and holes may be used to facilitate width adjustment.

Alternatively, as in FIG. 16, locking bar 137 may be hollow and threaded with a coarse thread; it is captive within left bracket 134 and slotted back hole 133. Right section of locking bar 138 is screwed into portion 137 and can be quickly length adjusted by twisting it clockwise or counter-clockwise. Horizontal section 131 fits into section 132 in a telescoping fashion. After the notebook or laptop computer or other personal electronic to device display is placed between the spread-apart brackets, the brackets are pushed against its sides and swinging locking bar portions 137 and 138 are adjusted accordingly to fit into holes in right bracket 135 for locking.

FIG. 17 shows a different width adjustable computer or other personal electronic device lock 170 with a discrete locking mechanism including pivoted flange 178 with peg 176 at its distal end. Flange 178 is pivoted on pivot 182, such as a rivet, attached to outer telescoping member 132 of notebook computer or other personal electronic device lock 170. When swung in the direction of arrow 179, flange 178 will force peg 176 through hole 175 in telescoping section 132 and further into one of the holes 180 in inner telescoping member 171 when in positional registration. Flange 178 is locked in position when hole 185 is in positional registration with hole 184 and locking bar 173 end 139 is passed through both. The swinging locking bar includes hollow side section 172 and inner, preferably solid, side section 173, which is telescopic within outer hollow side section 172.

FIG. 18 shows another embodiment 150 of this invention wherein the locking base has been integrated with the notebook computer or other personal electronic device lock. Clamp 153 locks onto work surface 85 as described in a previous embodiment with a separate locking base 81 (see FIGS. 13-14). Upright brackets 151 and 152 with bar 83 between capture the notebook computer or other personal electronic device display which is then locked via swinging locking bar 84 and a key lock (not shown).

A related embodiment in FIG. 19 shows integrated base/computer or other personal electronic device lock 160 which has one or more pivot points 164 and 166 (on base part 167). Link 165 now pivots in relation to clamp section 163 such that the notebook computer or other personal electronic device lock 160 can be more conveniently positioned on work surface 85.

In FIG. 19, for example, clamp 163 is placed on the edge to the side of computer or other personal electronic device lock base 167 instead of directly in front of it as would be necessary in the embodiment of FIG. 18.

The preferred low profile locking base embodiment of this invention for consumer use is detailed in FIGS. 20-27.

Figure 20:
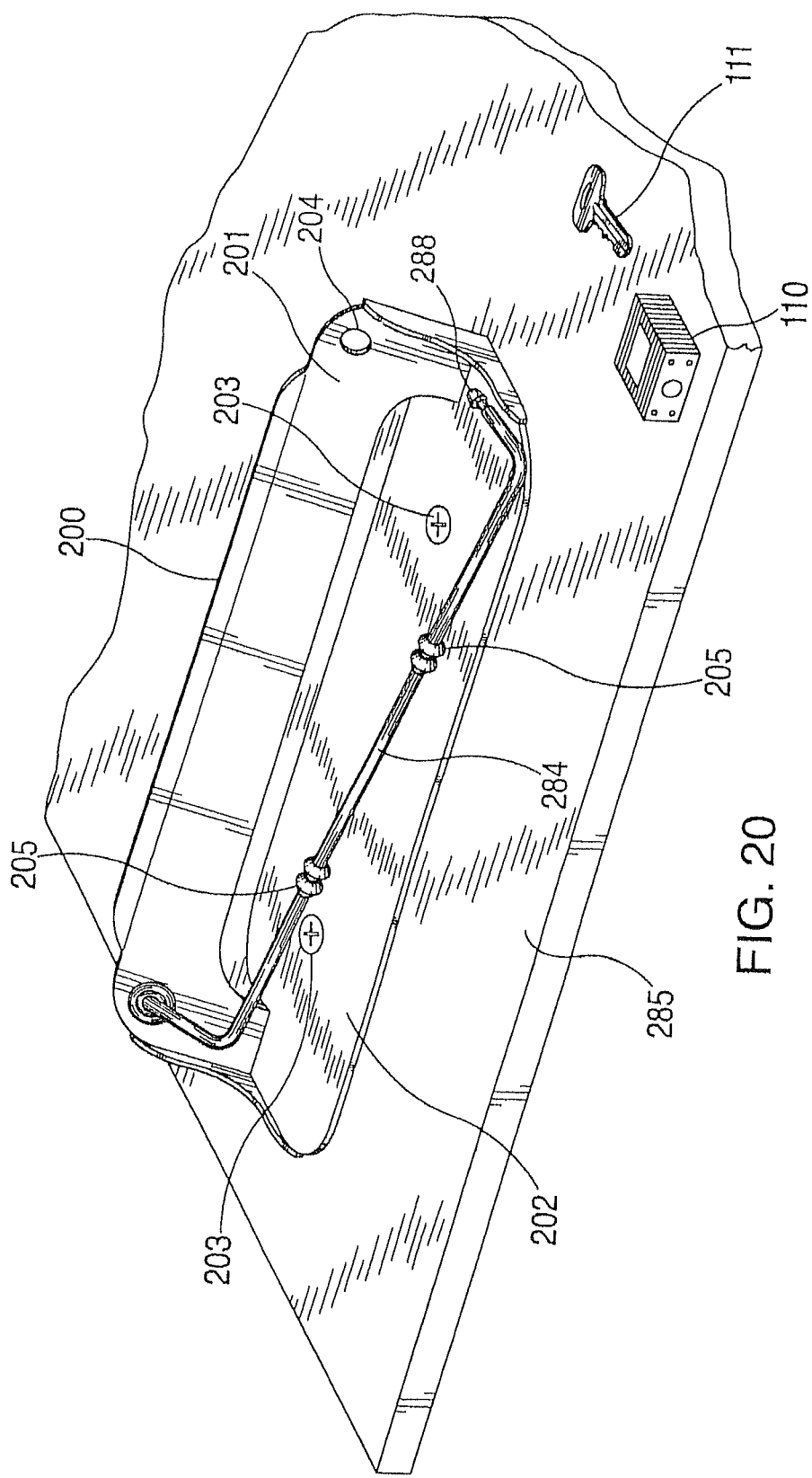
FIG. 20 is a perspective view of a preferred embodiment for a low profile notebook computer, shown attached by fasteners, such as screws, down to the work surface.

FIG. 20 shows a low profile locking base 200 with narrow base 202 and low rise back 201. It is screwed to work surface 285 via fasteners, such as screws 203. Locking bar 284 with optional rubber or elastomer grommets 205 and machined end 288 is used to lock the display of a notebook or laptop computer or other personal electronic device (not shown) to locking base 200. End 288 is passed through hole 204 and locked with pin lock 110. Key 111 is used to unlock and remove the computer or other personal electronic device.

Figure 21:
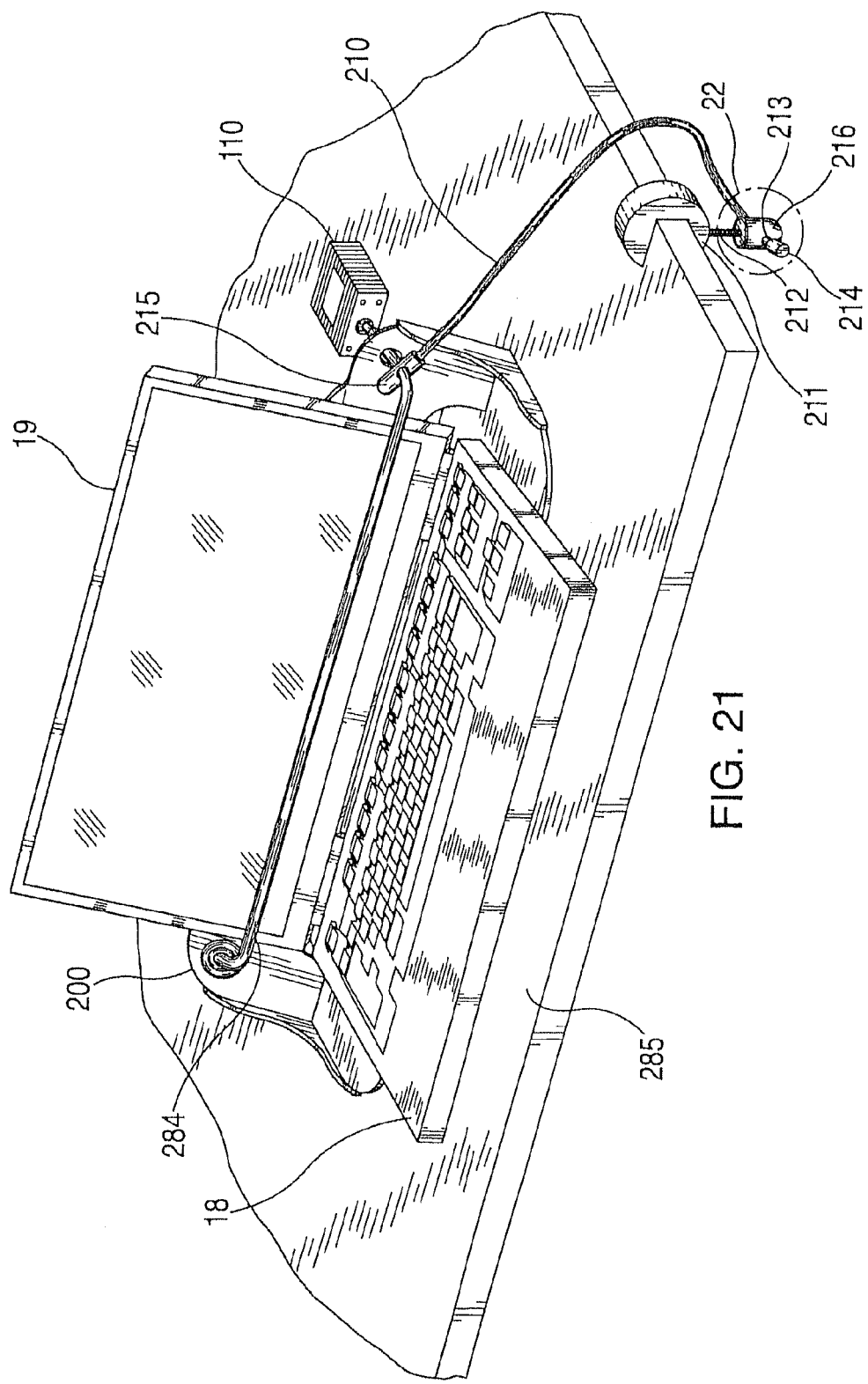
FIG. 21 is a perspective view of the locking base of FIG. 20 used as a portable device secured to the work surface via a cable and clamp.

The preferred simpler method of use of a locking base is not to screw it down as shown in FIG. 20 but instead to create a portable locking kit by adding a clamp 211 and cable 210 as shown in FIG. 21.

Due to the low profile design with a narrow base, all components of the portable kit conveniently fit into a tubular carrying case (not shown).

FIG. 21 also shows Clamp 211 having a fastener, such as a screw subassembly, including screw 212 and short container, such as a cylinder 216, with transverse cable attachment hole 213. At the first end of cable 210 is a ferrule 215 with a transverse hole. This fits through hole 213. The cable is threaded through hole 213 after clamp 211 is secured using the appropriate tool to tighten screw 212. The distal end of cable 210 has ferrule 214 with enlarged end which does not fit through hole 213.

FIG. 22 shows the arrangement more clearly. It is noted that cylinder 216 has distal hole 220 which accommodates the screw head and also has a screw clearance hole 221 on its top surface. After cable 210 is threaded through hole 213, a tool cannot reach screw head 222 to loosen clamp 211 since access is denied through distal hole 220. After cable 210 is installed through cylinder 216, the end 288 of locking bar 284 is passed through the transverse hole in ferrule 215 prior to locking bar 284 to base 200.

In an alternate embodiment of the clamp screw subassembly no tool is required to tighten or loosen clamp 211.

For example, an exploded view of subassembly 230 is shown in FIG. 23 with end cap 231 pushed down over clamp screw 233 and press fit into the end of knob 235. Optional pins 238 can be driven radially to insure positive attachment. Cap 231 has screw clearance hole 232 at its center. Screw 233 becomes captive as a subassembly with tall head 234 within knob 235 once cap 231 is attached. Offset transverse hole 237 in knob 235 goes through both walls and is sized for cable attachment.

FIG. 24 shows the underside or cap 231 revealing hexagonal recess 240 sized to engage bolt head 234.

FIG. 25 is a top view of subassembly 230. In the side cross-section of FIG. 26, bolt head 234 is seated in recess 240 of cap 231. This is prior to the insertion of cable 210 through holes 237. Clamp 211 can be tightened in this depicted configuration by turning knob 235 since recess 240 acts as a socket wrench to bolt 233. It is noted also that the size of head 234 interferes with the placement of hole 237 thereby preventing insertion of cable 210 while head 234 is seated in recess 240.

If knob 235 is Pushed up as shown in FIG. 27, cable 210 can now be easily inserted through holes 237 adjacent to screw 233 and spacing head 234 away from recess 240. In this configuration with cable 210 installed through knob 235, if turned, knob 235 will spin freely regardless of the up or down forces exerted. Clamp 211 can only be removed after cable 210 is removed and head 234 is re-seated in recess 240. In lieu of a non-standard screw 233 with tall head 234, a standard hex screw can be used with a nut screwed up against the head and adhesively bonded as a unit. A washer between the nut and the screw head would only enhance the operation creating a more positive barrier with cable 210.

In an alternate protruding member locking embodiment of this invention, spikes, security rods or strips are used to secure a personal electronic device, such as a notebook computer, cell phone, personal digital assistant (PDA) or electronic music and/or video player (i.e. iPod®).

For example, in FIG. 28, a notebook computer or other personal electronic device with base 275 and display 276 is shown. One of the three through-holes is required for this embodiment. Hole 278 is at the hinge line, while hole 279 is through the display housing; hole 277 is diagonally through one of the front or rear corners of the base.

Figure 28A:
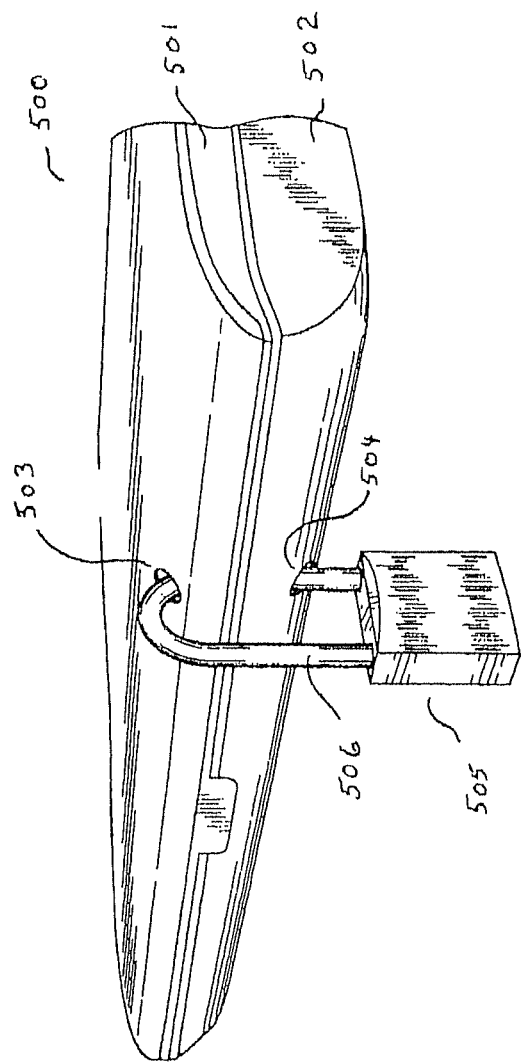
FIG. 28A is a perspective detail showing the closed front section of a notebook computer wherein a security feature is two through holes which align upon closing display lid permitting a padlock with an elongated hasp to lock the display to the keyboard base.

In the alternate locking embodiment shown in FIG. 28A, a notebook computer 500 has a through hole 503 in the display portion which aligns in positional register with through hole 504 in the base or keyboard portion 502 when in the closed position. A protruding lock, such as, for example, padlock 505 with elongated hasp 506, is used to prevent display portion 501 from being opened in a usable position. In addition, if a secure cable with a loop on its distal end is in the vicinity, this loop can also be engaged by hasp 506 thereby securing computer 500 to fixed location. Other protruding locks, such as spikes, security rods or strips, can also be used to lock display portion 501 with keyboard portion 502 when in the closed position.

Figure 28B:
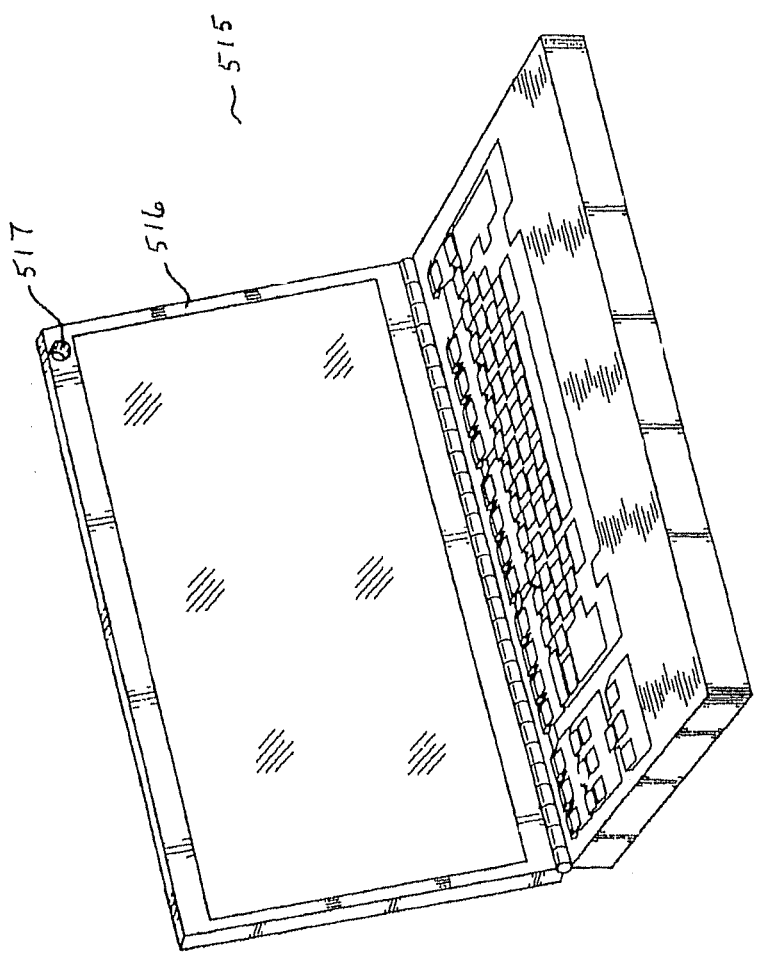
FIG. 28B is a perspective view of a notebook computer with a security hole in the top right corner of the display section.
Figure 28D:
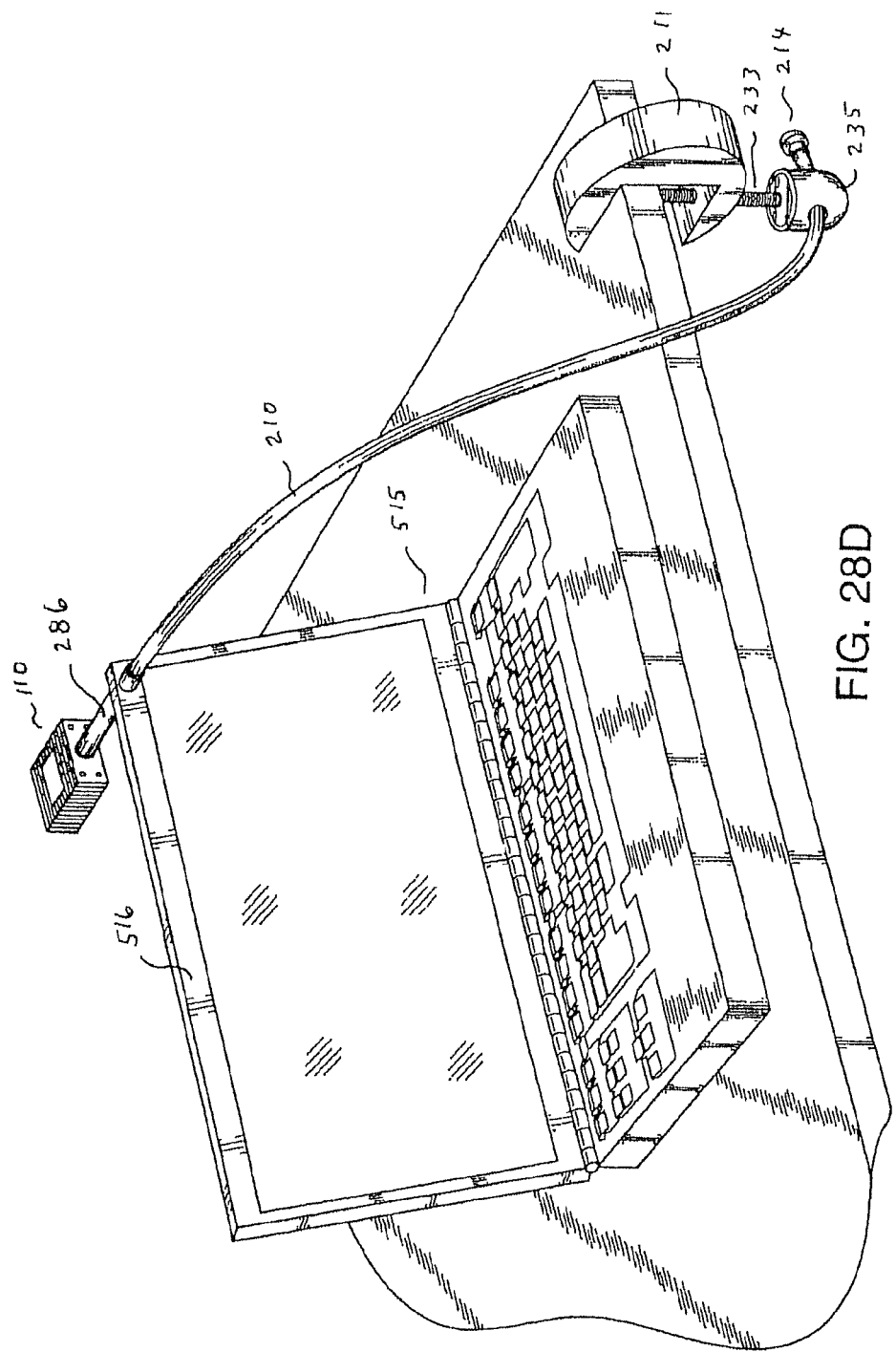
FIG. 28D is a perspective view of the computer of FIG. 28C after pin lock is used to secure ferrule thereby using a cable to secure computer to a table top.

FIGS. 28B-D illustrate yet another locking embodiment for notebook computer 515 with display 516 which has a security hole 517 in the upper right corner of display portion 516. Hole 517 is a through hole. FIGS. 28C and 28D illustrate how the apparatus of FIG. 29 (without spike 285) is used to secure computer 515. Ferrule 286 is passed through hole 517 and locked by pin lock 110. In this manner cable 210 attaches computer 515 to secure table top clamp 211 or to another securing member, such as a table leg of the work surface upon which notebook computer 500 is placed.

It is further noted that ferrule 286 can also be used to lock notebook computer 500 in place in the closed position as in FIG. 28A, or the hasp 506 of FIG. 28A can also be used to lock the display portion 516 of notebook computer 500 instead of ferrule 286 and pin lock 110 shown in FIG. 28C.

FIG. 29 shows locking rod or spike 285 which is inserted in any of the three hole locations discussed. Ferrule 286 with a groove near its distal end is then inserted through the transverse hole of spike 285 and locked with pin lock 110. Ferrule 286 is securely attached to cable 210 which had been passed through knob 235 after clamp 211 had been tightened at the edge of a table or desk top. In this manner, the illustrated notebook computer or other personal electronic device is secured via a secure cable.

Figure 30:
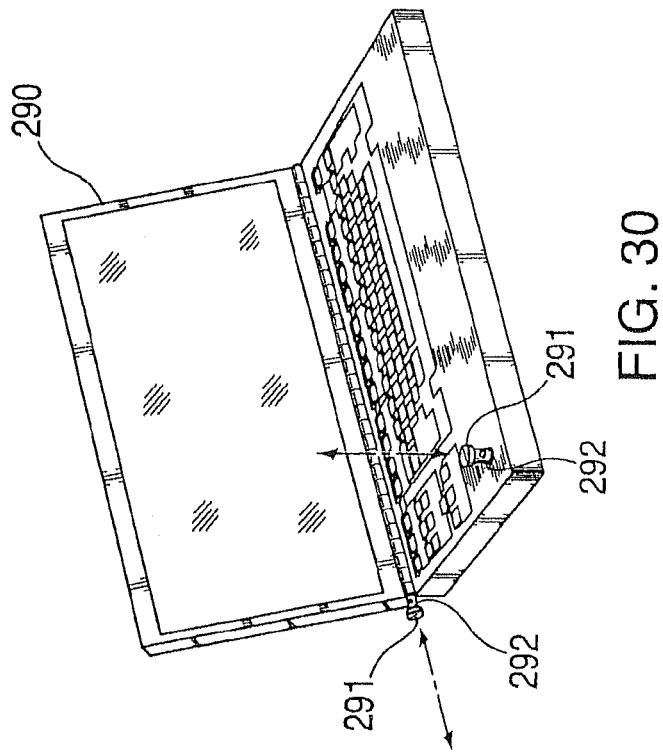
FIG. 30 is a schematic perspective view of a notebook computer with captive security rods for cable attachment.

In a variation of this embodiment, the separate spike 285 is replaced by a captive security rod 291 as shown in FIG. 30. Note that rod 291 may be attached either to one end of the hinge or alternatively to the top surface of the base of computer or other personal electronic device 290 at any convenient location where space permits. Rods 291 are stored in a recessed position with only a small knob protruding so that they may be easily grasped to unlock into the extended position to expose a transverse hole. Ferrule 286 and lock 110 are then used in the same manner as with the separate spike 285.

Figure 31:
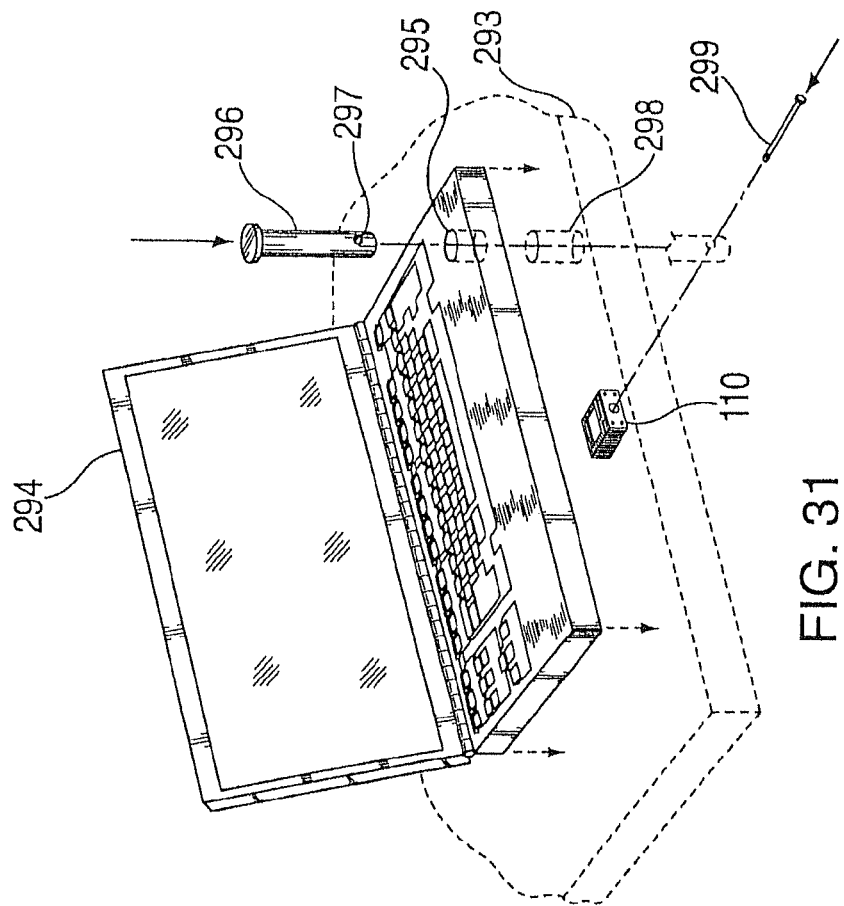
FIG. 31 is a schematic perspective view of a notebook computer with a hole downward through the base for use with a long protrusion spike and a transverse locking pin.

In another spike variation shown in FIG. 31, long spike 296 is used to secure computer or other personal electronic device 294 which has a hole 295 through its base. Hole 295 is placed over pre-existing hole 298 through table top 293; then spike 296 is inserted such that transverse hole 297 is accessible beneath table top 293. Then transverse pin 299 with a groove adjacent its distal end is inserted through hole 297 and locked with pin lock 110. Thus this variation locks a notebook computer or other personal electronic device using a spike without the aid of a cable.

Figure 32:
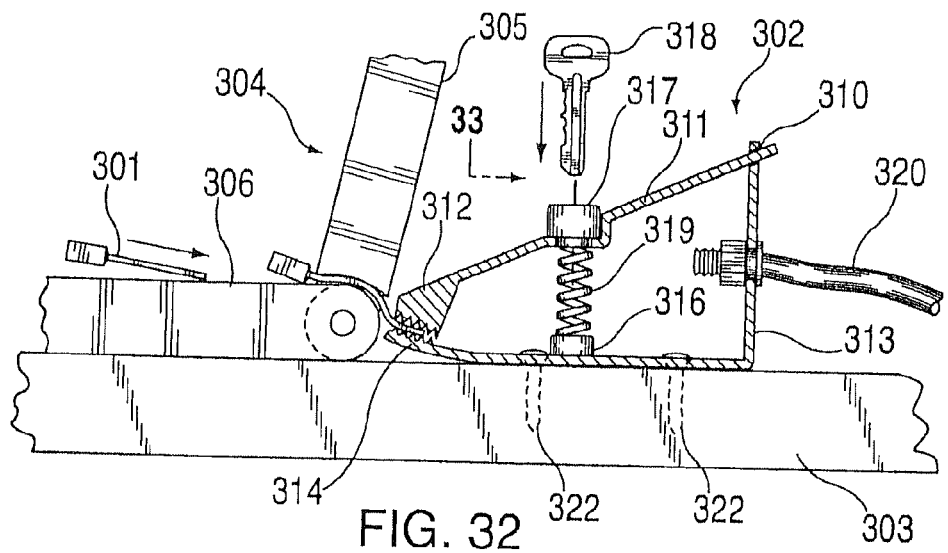
FIG. 32 is a diagrammatic side elevational view of one embodiment for a flexible strip lock for a computer.

In another embodiment shown in FIG. 32 with a flexible locking strip 301, a detail of notebook computer 304 with display 305 and keyboard portion 306 is shown adjacent to clamp 302. Flexible locking strip 301 is shown prior to insertion through the hinge gap between display 305 and keyboard 306 (not shown) and further between bottom jaw 314 and top movable jaw 312 of clamp 302.

In lieu of being inserted within a hinge gap, flexible locking strip 301 may be inserted within a thin, longitudinally extending slot, similar to holes 277, 278, 279 for rod 285 of FIG. 29.

Figure 33:
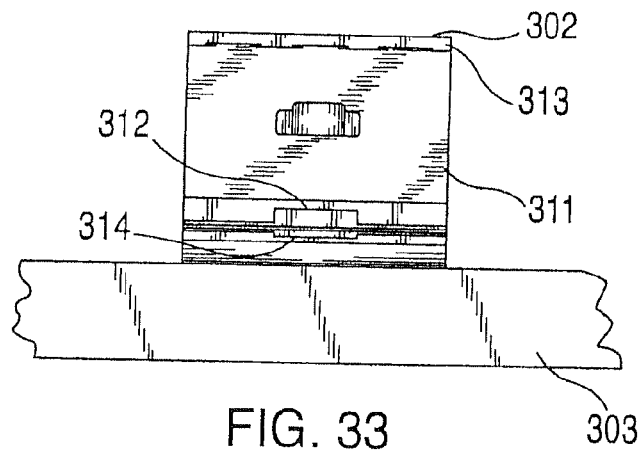
FIG. 33 is a front elevational view thereof, taken in the view direction of arrow "33" shown in FIG. 32.
Figure 34:
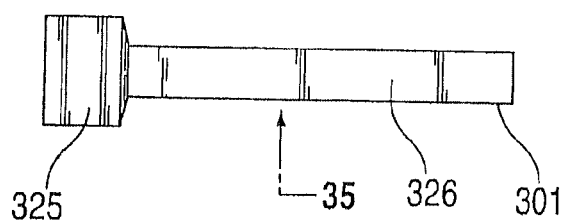
FIG. 34 is a top plan view of the shim strip of the flexible lock.
Figure 35:
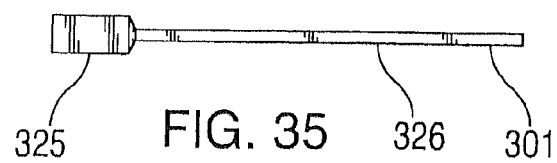
FIG. 35 is a side elevational view taken in the view direction of arrow "35" of FIG. 34.
Figure 36:
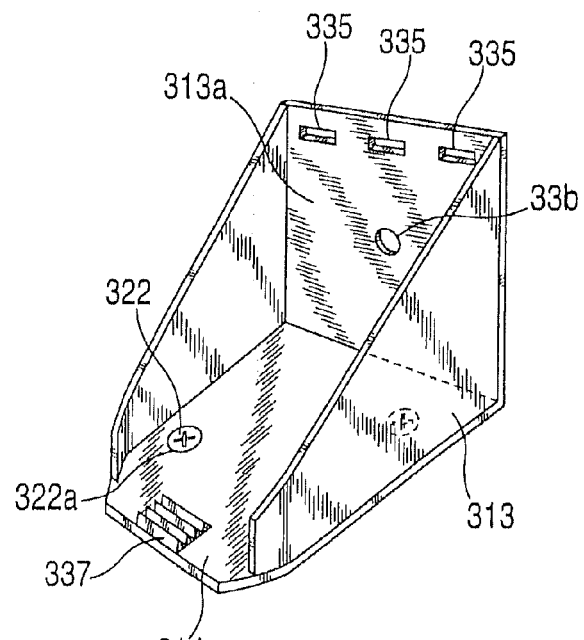
FIG. 36 is a perspective view of a lower protective shoe of the flexible lock.
Figure 37:
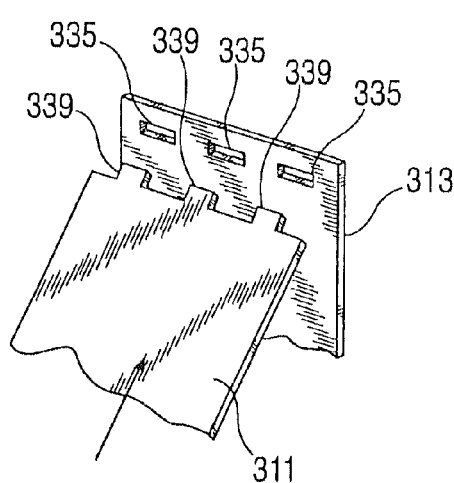
FIG. 37 is a diagrammatic perspective view illustrating a flexible locking means.

FIGS. 33, 36 and 37 show other features of clamp 302 with movable top 311 and stationary base 313. Locking strip 301 is clearly shown in top view and side view in FIGS. 34 and 35 respectively. Wedge stop 325 is shown at one the proximal end with narrow rectangular strip 326 at the distal end. Wedge stop 325 is preferably plastic which is bonded to strip 326 as by overmolding. It is noted that base portion 313 of clamp 302 is typically screwed to work surface 303 via screws 322, however, alternatively security cable 320 with secured distal end (not shown) can be used.

Gripping means, such as serrations 337 in FIG. 36, form lower static jaw 314 of FIGS. 32 and 33; they engage strip 301. Hole 336 is used for optional cable 320. Holes 322*a* accommodate fasteners 322, such as screws. Rectangular holes 335 accept tabs 339 of upper movable jaw 311 to form a hinge. The vertical wall 313*a* of base 313 can be alternatively joined to movable section 311 via ordinary hinges.

Figure 39:
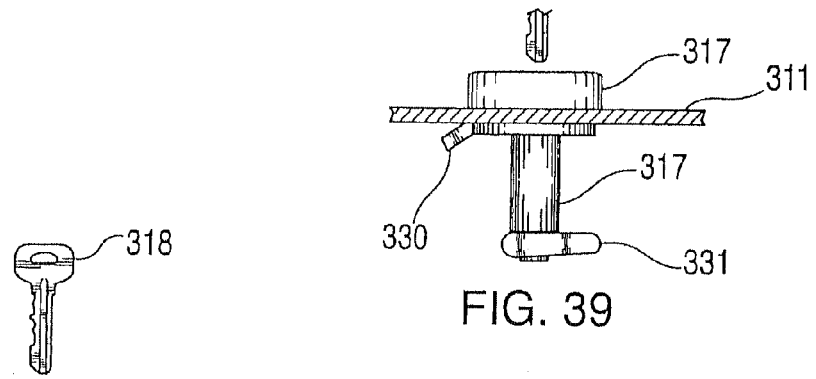
FIG. 39 is a partial view of a key locking means.
Figure 38:
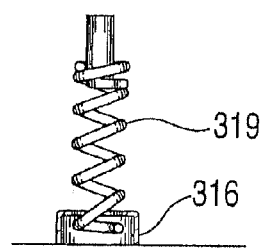
FIG. 38 is a diagrammatic exploded view of a key locking means with a spring.

As in FIGS. 38 and 39, spring 319 tends to keep jaws 312 and 314 slightly apart unless lock 317 is locked via key 318. In that case if key 318 is rotated while moving member 311 is pressed down, lock tang 331 will engage lock recess 316 at the distal end of spring 319; recess 316 is attached to base 313. This action will lock locking strip 301 between jaws 312 and 314. Note that lock 317 is attached to hinged part 311 via a fastener, such as lock nut 330.

FIGS. 40-43 show notebook computer 304, cellular phone 346, PDA 347 and personal DVD player 348 each with hinge gap 345. In addition, the entry path of locking strip 301 is shown by arrows in FIG. 40.

Figure 40:
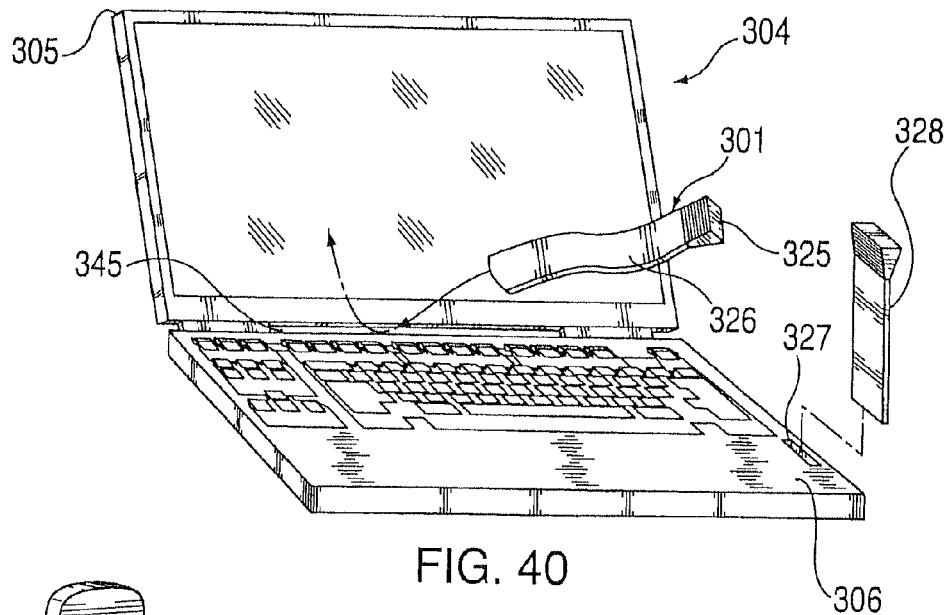
FIG. 40 is a perspective view of a notebook computer showing the hinge gap and the path of weaving the distal end of a locking strip through the hinge gap, as well a slot in the housing of the notebook computer permitting access to a rigid protruding locking strip therein.
Figure 41:
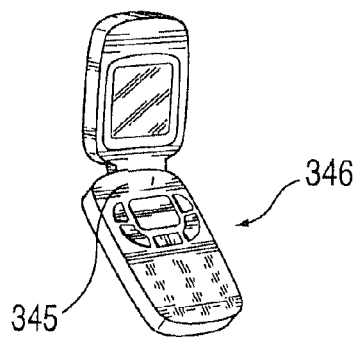
FIG. 41 is a perspective view of a "flip top" cellular phone showing the hinge gap.
Figure 42:
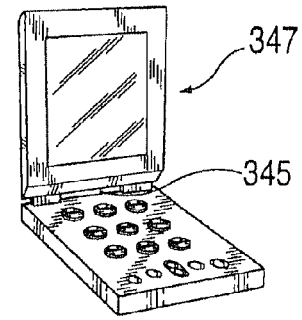
FIG. 42 is a perspective view of a PDA showing the hinge gap.
Figure 43:
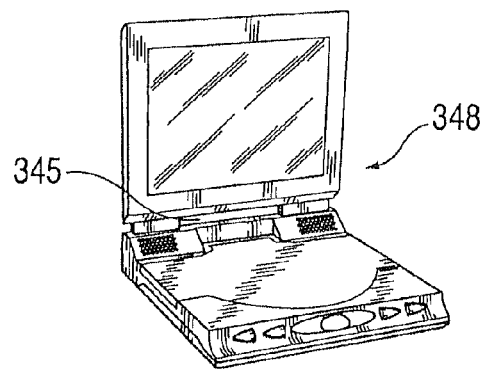
FIG. 43 is a perspective view of a personal DVD player showing the hinge gap.
Figure 44:
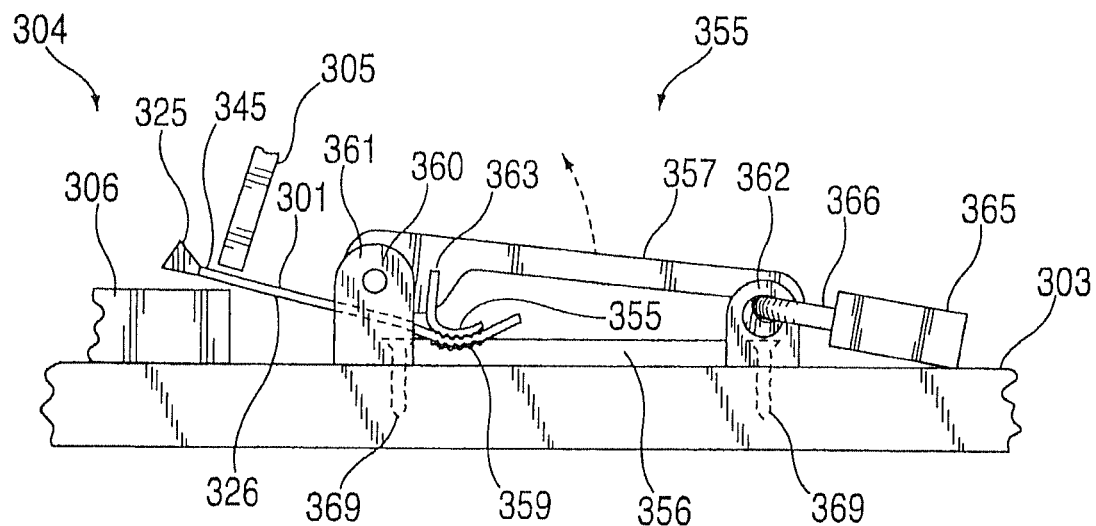
FIG. 44 is a side elevation of an alternative embodiment of a strip captivating locking clamp of this invention, shown using an ordinary padlock.
Figure 45:
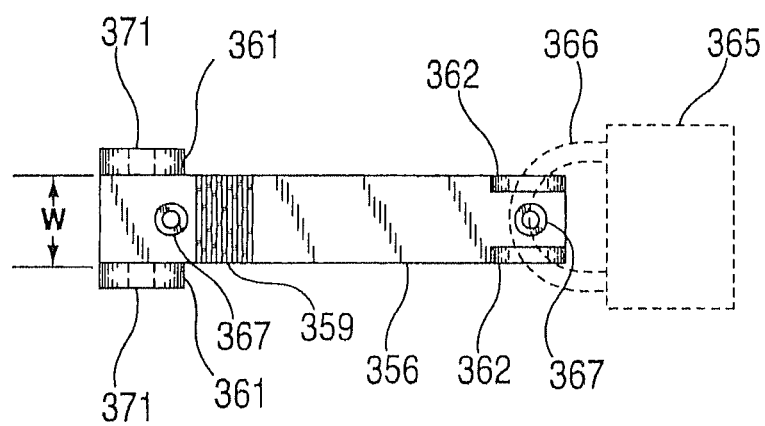
FIG. 45 is a top view of the base portion of FIG. 44.

FIG. 40 also shows a further alternate embodiment whereby the housing of notebook computer 304 contains a slot 326 for insertion of a flexible or rigid locking strip 328 therethrough.

Figure 46:
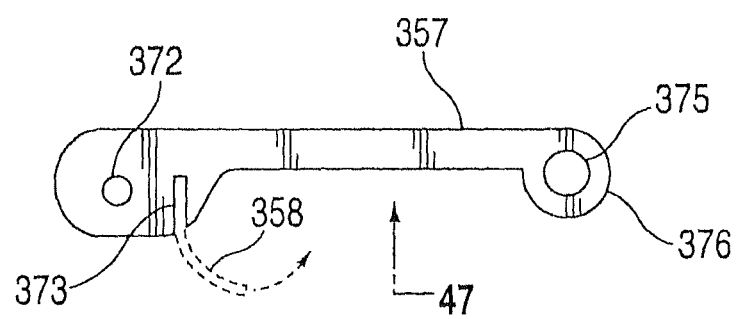
FIG. 46 is a side elevation of the handle portion of the alternate embodiment clamp of FIG. 44.
Figure 47:
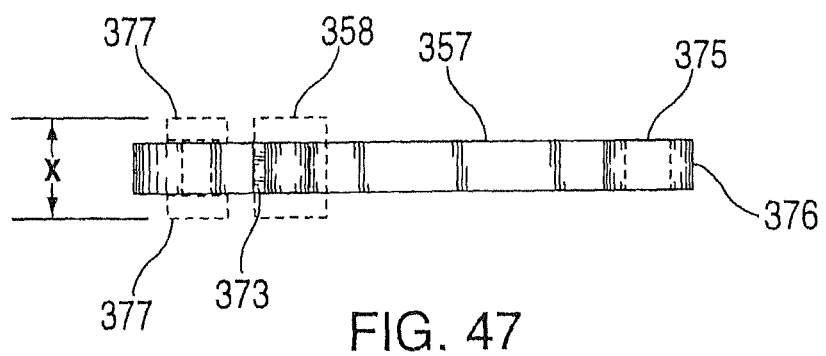
FIG. 47 is a bottom view (in the direction of arrow "47" in FIG. 46) of the handle of FIG. 46.

FIGS. 44-47 relate to an alternate embodiment of clamp 355 which incorporates a leaf spring 358 to impart locking force to locking strip 301 when shackle 366 of padlock 365 is passed through lock loops 362 and handle loop 376 (as in FIG. 46). In this embodiment, shallow recess 359 with transverse serrations aggressively grasps strip end 326 under bending force of spring 358, which itself can have optional transverse serrations on its contact surface.

When handle 357 is free to swing up, strip end 326 can be easily passed between brackets 371 which are spaced apart a distance "W" (as in FIG. 45) to accommodate the width of strip end 326. Base 356 is secured to work surface 303 via fasteners, such as screws 369, which are passed through countersink holes 367 (as in FIG. 45). Leaf spring 358 is swaged or brazed at region 363 within slot 373 of handle 357. Hole 375 in loop 376 accommodates shackle 366. It is noted that spring 358 has to be bent somewhat for handle 357 to be in registration with the holes in padlock brackets 362. This bending also permits clamp 355 to accommodate strip ends 326 of varying thicknesses. Also, with respect to the geometry of spring 358 in FIG. 44, if a pulling force is placed on locking strip 301, frictional forces will tend to rotate the free end of spring 358 in a counter-clockwise direction thereby increasing clamping force on strip end 326; this further counteracts the pull-out force. Since spring 358 is wider than handle 357 (as in FIG. 47), centering washers 377 are used on either side of it to increase the combined width to X which is just slightly smaller than W. Rivet 360 in brackets 361 acts as an axle for handle 357; hole 372 is a clearance fit for rivet 360.

Figure 48:
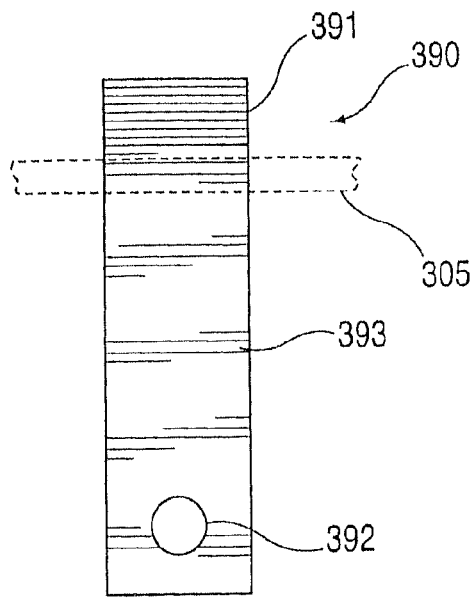
FIG. 48 is a top plan view of a further alternate embodiment for a locking strip of this invention.

FIG. 48 illustrates alternate embodiment locking strip 390 with locking wedge 391, strip 393 and end hole 392. Locking strip 390 may be rigid or flexible.

Figure 50:
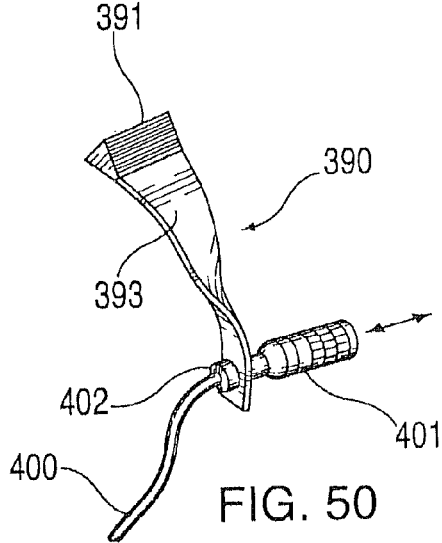
FIG. 50 is a perspective of an alternate method of securing the locking strip of FIG. 48 by the use of a secure cable and a cable lock.
Figure 51:
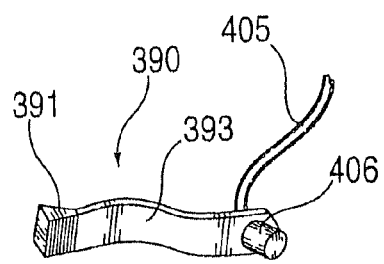
FIG. 51 is a perspective view of yet another method of securing the locking strip of FIG. 48 by virtue of a free cable with attached stop member.

Dashed lines 305 of FIG. 48 show the position of a computer display if this is being secured. Added hole 392 permits at least three non-clamp locking methods to be used. These are illustrated in FIGS. 49-51; for clarity, no item is shown being locked in these FIGS. 49-51.

It is understood that instead of being inserted through a hinge gap, locking strip 390 may be first passed through a thin, longitudinally extending slot in the housing of the personal electronic device, such as a notebook computer, instead of a round hole provided for a rod 285 or 296, as is shown in FIGS. 29-31. In this case, the thinness of the slot 327 for strip 328 minimizes any intrusion into the interior of the walls of the personal electronic device, such as a notebook computer 305 and the like, with its intricate wiring located in a tight space within the walls of the notebook computer 305, or other personal electronic device.

The strip 390 may be a rigid rectangle or other geometric shape. Additionally strip 390 may be flexible. If flexible, strip 390 may pass through a slot in the housing of the personal electronic device, or if the device is hinged, through a hinge gap between the display of the device and the main body of the device being secured.

Figure 49:
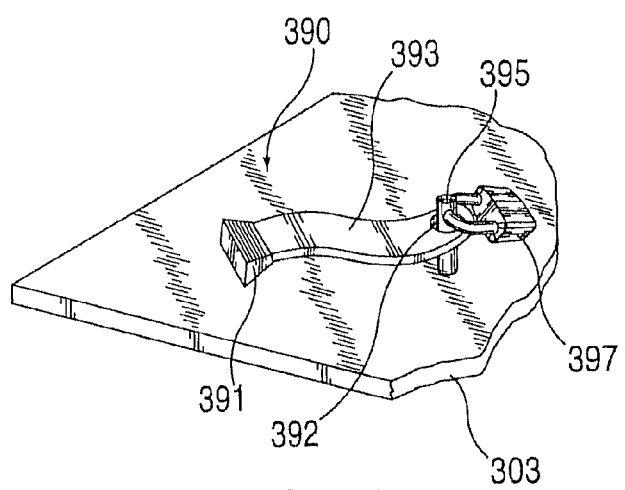
FIG. 49 is a perspective view of the locking strip of FIG. 48 secured to a stud attached to the work surface by the use of a padlock.

In FIG. 49, stud 395 is attached to and protrudes from work surface 303. Hole 392 is simply passed over the distal end of stud 395 and then the shackle of padlock 397 is passed through the transverse hole in stud 395 to lock strip 390.

In FIG. 50, secure cable 400 with collar 402 and a rigid stud at its distal end is used to secure strip 390. After the rigid stud is passed through hole 392, cable lock 401 is snapped over the end of the stud thereby securing strip 390.

In FIG. 51, free cable 405 with lock member 406 permanently attached is passed through hole 392. Since member 406 is a bulge larger than the diameter of hole 392, locking strip 390 will be secured when the distal end of cable 405 is looped or otherwise secured to work surface 303 or to some point adjacent to it.

The plunger type security lock will now be described with reference to FIGS. 52, 53, 54A, 54B, 55A, 55B, 56, 57, 58A and 58B.

Figure 52:
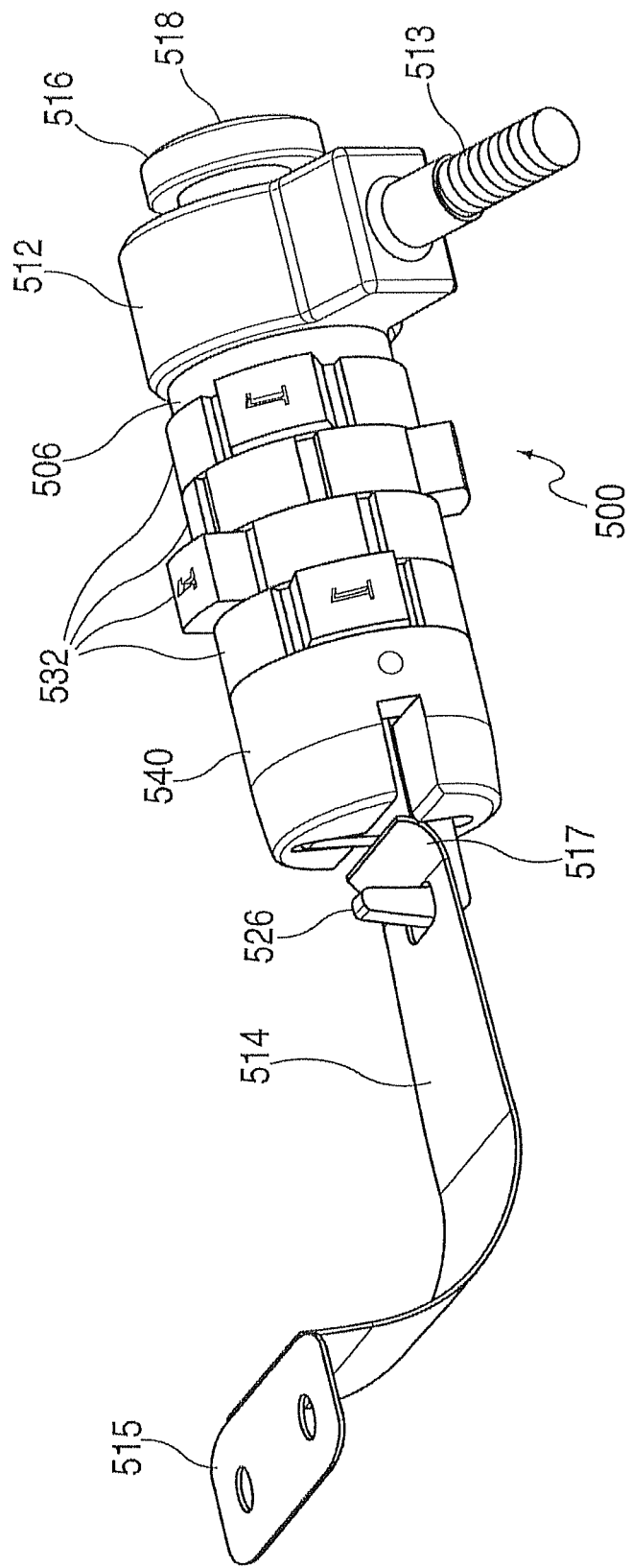
FIG. 52 is a perspective view of one embodiment of a plunger-type security lock of the invention.
Figure 53:
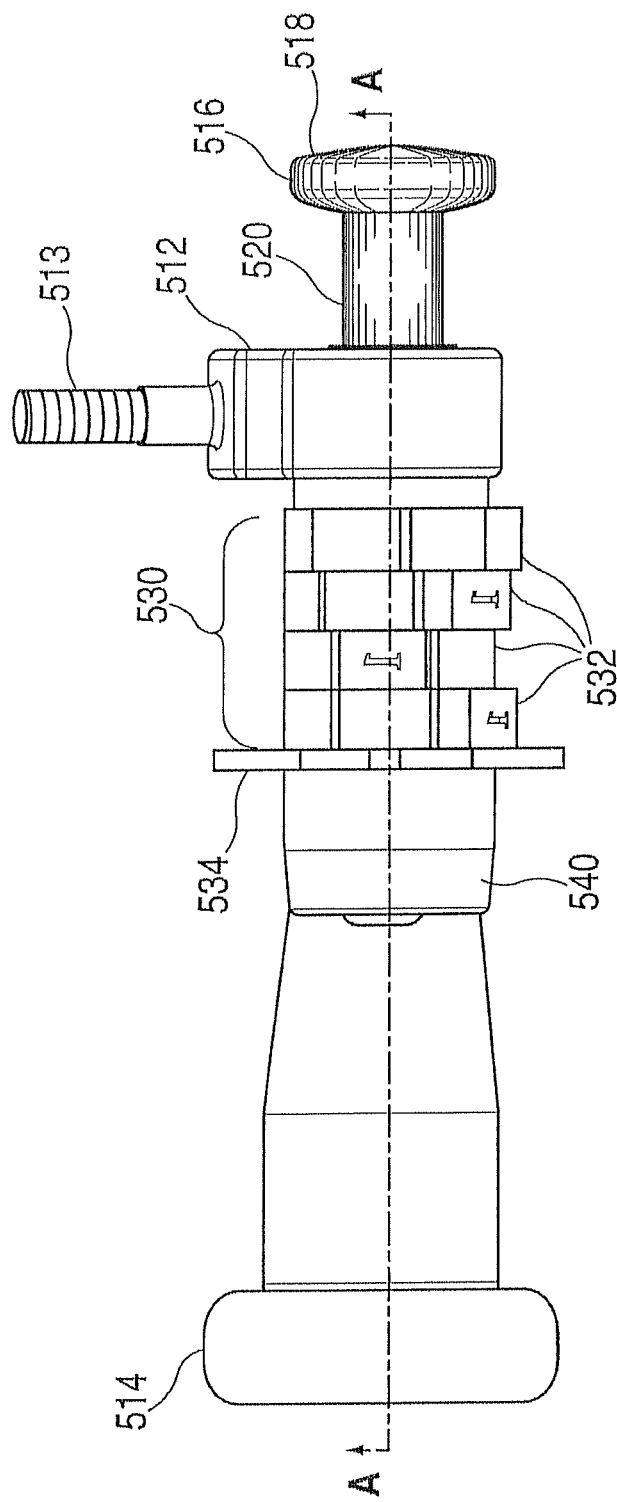
FIG. 53 is a plan view of another embodiment of a plunger-type security lock of the invention.

FIG. 52 depicts a perspective view of a plunger-type security lock 500 of the invention. While security lock 500 is designed for use with electronic devices such as notebook computers and like devices, e.g., those with a base connected by a hinge to an upper section typically comprising a display device, the invention is not limited thereto. The invention is not limited to what is to be locked or secured, but only that the object to be locked or secured have a hinge or through hole through which a flexible locking strip may pass to its stopping means (e.g., wedge), which is then hooked or captured by the end of the sliding key of the security look, as will now be described in detail.

Figure 55B:
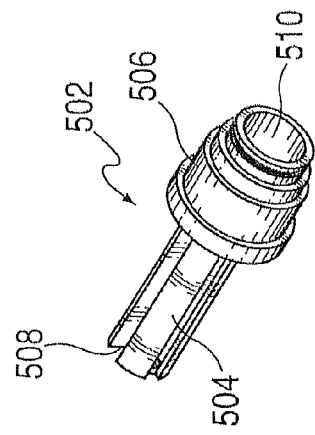
FIGS. 55A and 55B are alternative perspective views of a cylindrical sliding key receptacle.
Figure 56:
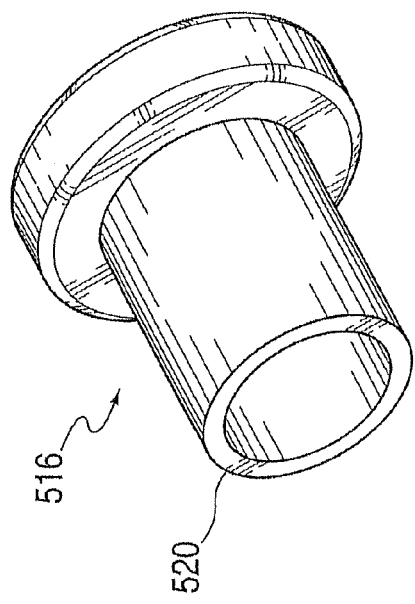
FIG. 56 is a perspective view of a cylindrical plunger.
Figure 55A:
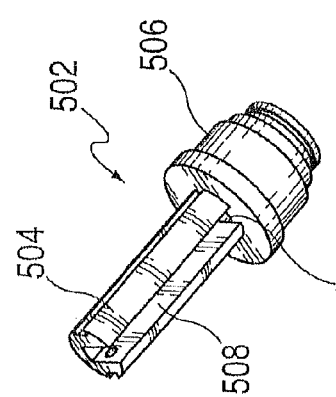
Figures 57, 58A, 58B:
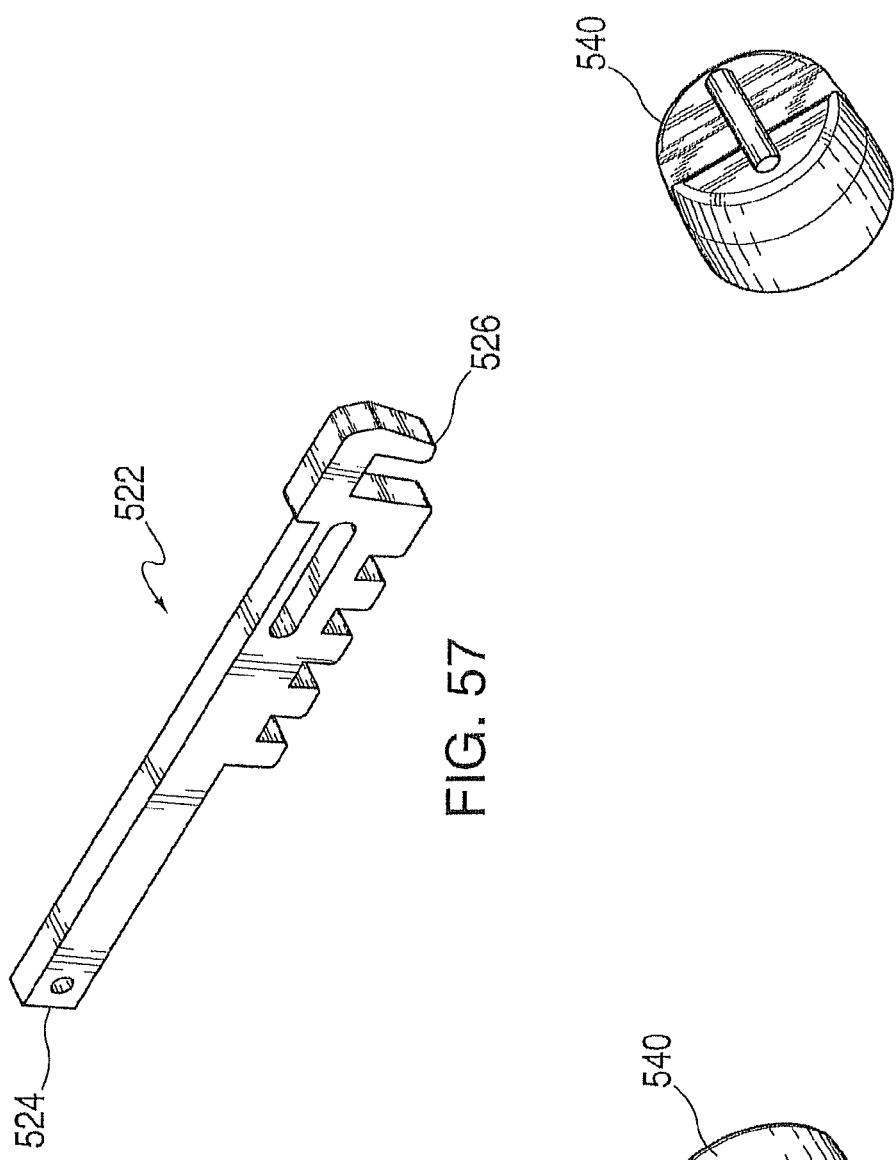
FIG. 57 is a perspective view of a sliding key.
FIGS. 58A and 58B are bezels.

Plunger-type security lock 500 includes a cylindrical sliding key receptacle 502, shown in the perspective views of FIGS. 55A and 55B. The cylindrical sliding key receptacle comprises a slotted, first cylindrical portion 504 and a second cylindrical portion 506. The slotted, first cylindrical portion 504 includes a first end formed with a slot 508 extending longitudinally through to its other end, and opening into the second cylindrical portion. The second cylindrical portion is formed as an open cylindrical cavity 510 that is contiguous with the first cylindrical portion's open slot 508.

A locking member 512 (for example, a ferrule) is arranged on an outer cylindrical surface of the second cylindrical portion 504 of the sliding key receptacle 502 that is configured for attachment to a cable 513. The cable is then attached to a stationary object such as a post, pillar, heavy desk, or other fixture that is substantially immobile.

A cylindrical plunger 516, having a pushing end 518 and a cylindrical plunger end 520, is configured for insertion into the second cylindrical portion of the sliding key receptacle 502. A sliding key 522, comprising a flat, longitudinal member constructed with a rectangular cross-section that includes a hooking end 524 and a plunger-contact end 526, which sliding key is configured with a key definition (see rectangular cut out teeth) and for slidable spring-loaded operation within (slot 508) the slotted, first cylindrical portion 504 in cooperation with the cylindrical plunger 516 and spring 528 in order to extend and hook a flexible locking strip and retract with and lock the locking strip 514 in locking state.

A locking mechanism 530 defines the locking state in cooperation with the key definition. Locking mechanism 30 comprises a plurality of number dials 532 (four in the embodiment shown) arranged about an outer surface of the slotted, first cylindrical portion 508 to prevent the extending of the sliding key 522 when arranged in the locking state and to allow extending of the sliding key when in an unlock state. The locking state and unlock state are correlated to a numerical setting of the number dials in cooperation with the key definition. Spring washers (not shown in the drawing) are included to maintain the number dials, as well as a finger grip flange 534 (not shown in the FIG. 51 embodiment).

The locking member 512 or ferrule preferably comprises a cable for tethering the security lock to an anchoring means, such as a desk or stanchion, without limitation. The locking strip 514 for which the hooking end 526 of the sliding key 522 is configured to hook when extending from the sliding key receptacle 502 is configured with a blocking end 515, and to slide through an electronic device (304; FIG. 40), i.e., via a through opening, up to the blocking end. For example, a through opening may comprise a hinge gap between two parts. The blocking end may be formed as a wedge. In this way, the electronic device is secured to the plunger-type security lock (500) when in a locking state.

A bezel 540 is arranged about an outside diameter of the open end of the slotted, first cylindrical portion 504 of the sliding key receptacle 502, through which a portion of the longitudinal member of the sliding key 522 extends and retracts.

Spring 528 is positioned to cooperate with the sliding key 522, the sliding key receptacle 502 and the plunger 516 to provide the spring loaded sliding key movement in cooperation with locking mechanism 530.

In another embodiment, the invention comprises an electronic device with security locking system. The electronic device 305 is required t have a through slot, such as a hinge gap (FIG. 40). A flexible locking strip 514 includes an insertion end 517 and a stopping end 515, configured for insertion partially through the through slot or hinge gap up to the stopping end 515. A plunger-type security lock (500) comprising a cylindrical sliding key receptacle 502 with a slotted, first cylindrical portion 504 and a second cylindrical portion 506, a locking member 512 arranged on an outer cylindrical surface of the second cylindrical portion 506 of the sliding key receptacle 502 is configured for attachment to a tether means (i.e., cable, chain, etc.) 513, a cylindrical plunger 516, a sliding key 522 including a hooking end 526 and a plunger-contact end 524 that is configured with a key definition (cut out teeth) and for slidable spring-loaded operation within the slotted, first cylindrical portion 504 in cooperation with the cylindrical plunger 516 to extend and hook the flexible locking strip 514 and to retract with and lock the locking strip 514 in locking state and a locking mechanism 530 that defines the locking state in cooperation with the key definition.

In another embodiment, the invention includes a locking assembly for a notebook computer or other personal electronic device having a visual display portion attached to a keyboard base portion by a hinge. The assembly includes a notebook computer or other personal electronic device with visual display portion separated from a keyboard base portion by a hinge. A flexible locking strip including an insertion end and a stopping end, configured for insertion partially through the hinge up to the stopping end.

A plunger-type security lock 500 comprising a slotted, cylindrical sliding key receptacle 502, a locking member 512 or ferrule is arranged on an outer cylindrical surface of the sliding key receptacle 502 and is preferably attached to a tether means (e.g., cable or chain) 513. A cylindrical plunger 516 is included, as well as a sliding key 522 formed to include a hooking end 526 and a plunger-contact end 524. The sliding key is configured with a key definition to capture the numbers dialed in via the locking mechanism. A spring 528 is included to provide for spring loaded sliding key cooperation with the plunger and locking mechanism 530 within the slotted, cylindrical sliding key receptacle to extend and hook the flexible locking strip 514 and to retract with and lock the locking strip 514 in locking state.

In the preferred embodiment shown in FIGS. 59-65, the security apparatus of this invention is designed to engage diagonal corners of an electronic tablet (such as an iPad®).

Figure 59:
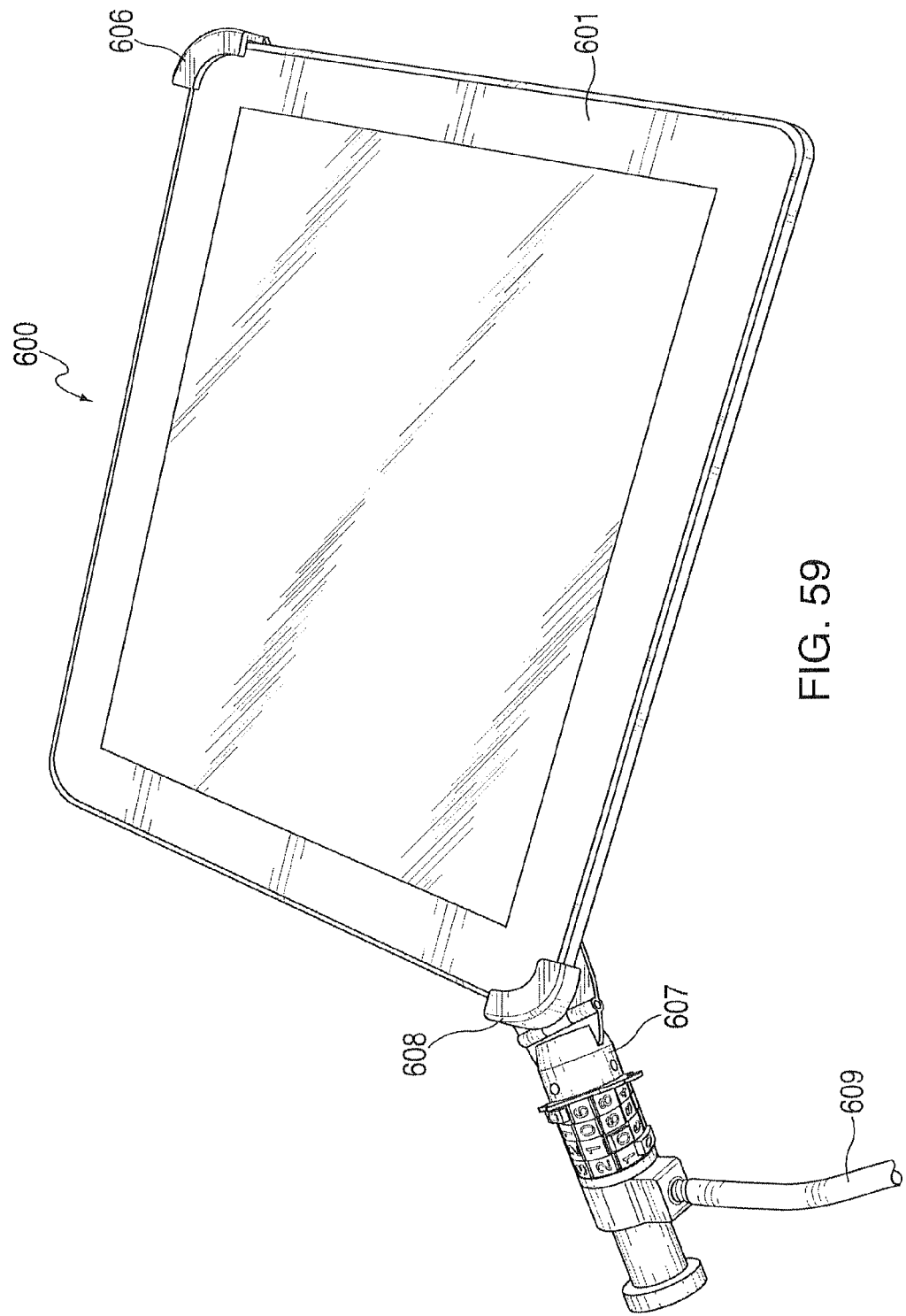
FIG. 59 is a perspective view of the security apparatus of this invention engaged with a computer tablet.

FIG. 59 shows apparatus 600 engaged with tablet 601 and securely locked to it via combination pin lock 607, such as, for example, plunger lock 500 of FIGS. 52-58. Distal corner pocket 606 engages one corner while proximal lockable corner pocket 608 assembly engages the diagonally opposite corner of tablet 601.

Figure 60:
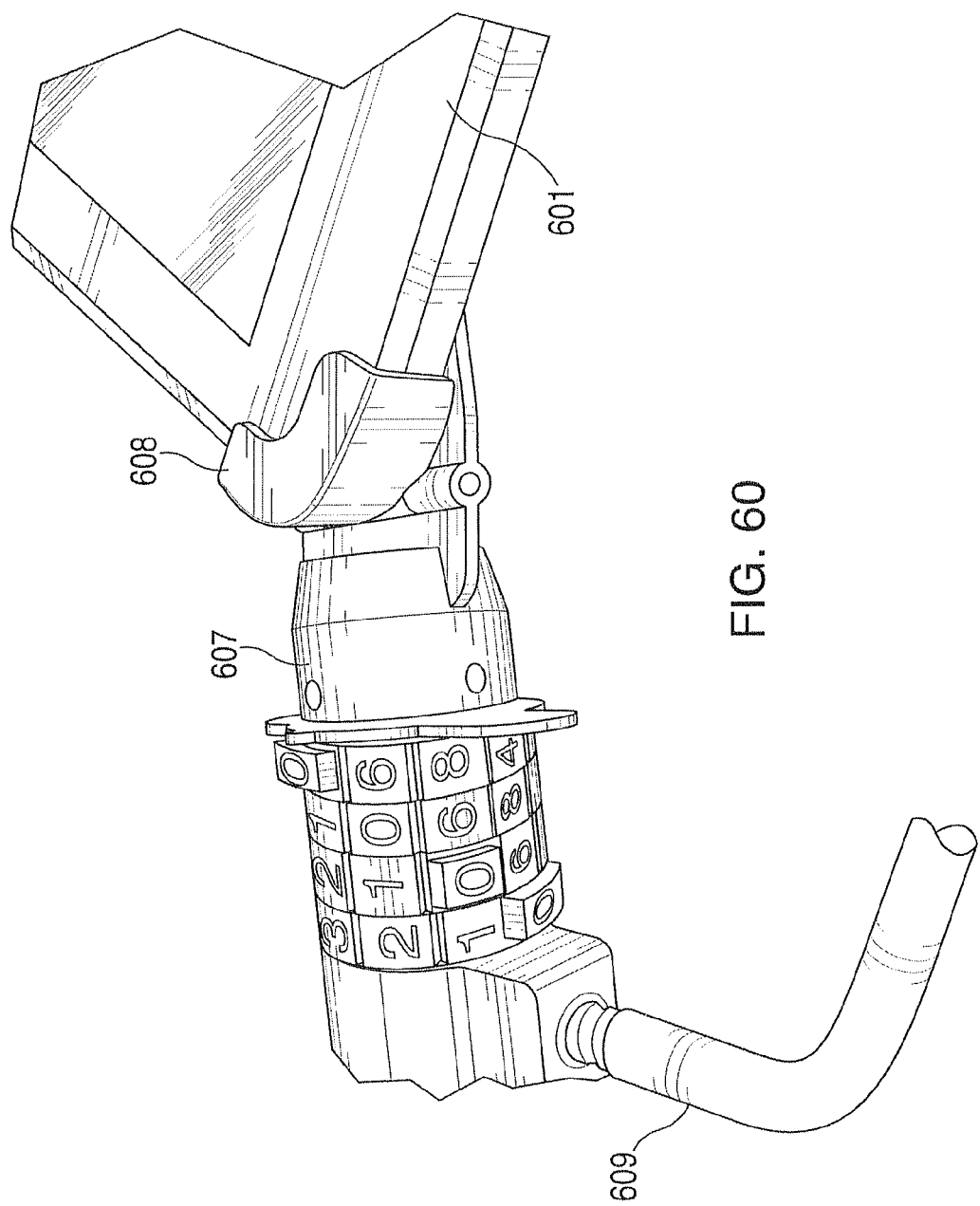
FIG. 60 is a perspective detail of the apparatus of FIG. 69 showing a close-up of the proximal locking mechanism with a pin lock.

FIG. 60 is a close-up detail view showing the engagement of pin lock 607. Cable 609, which is attached to lock 607 is used secure tablet 601 by engaging one corner thereof within proximal lockable corner pocket 608.

Figure 61:
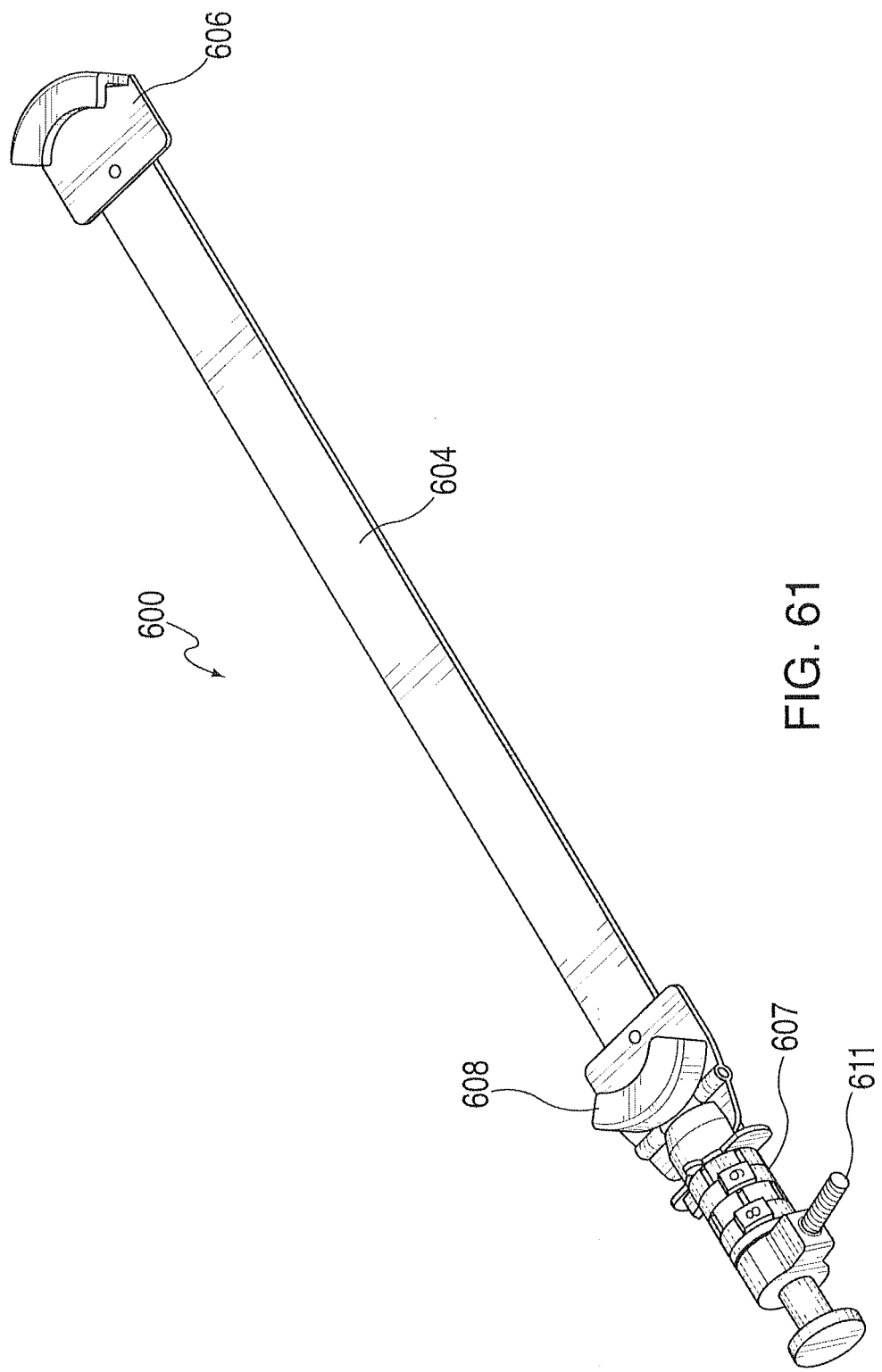
FIG. 61 is a perspective view of the security apparatus with the computer tablet removed for clarity.

Security apparatus 600 is more clearly shown in FIG. 61 which now reveals flat metal chassis bar 604 connecting distal pocket 606 to proximal pocket assembly 608. Note stud 611 attached to lock 607; it is permanently secured to cable 609.

Figure 62:
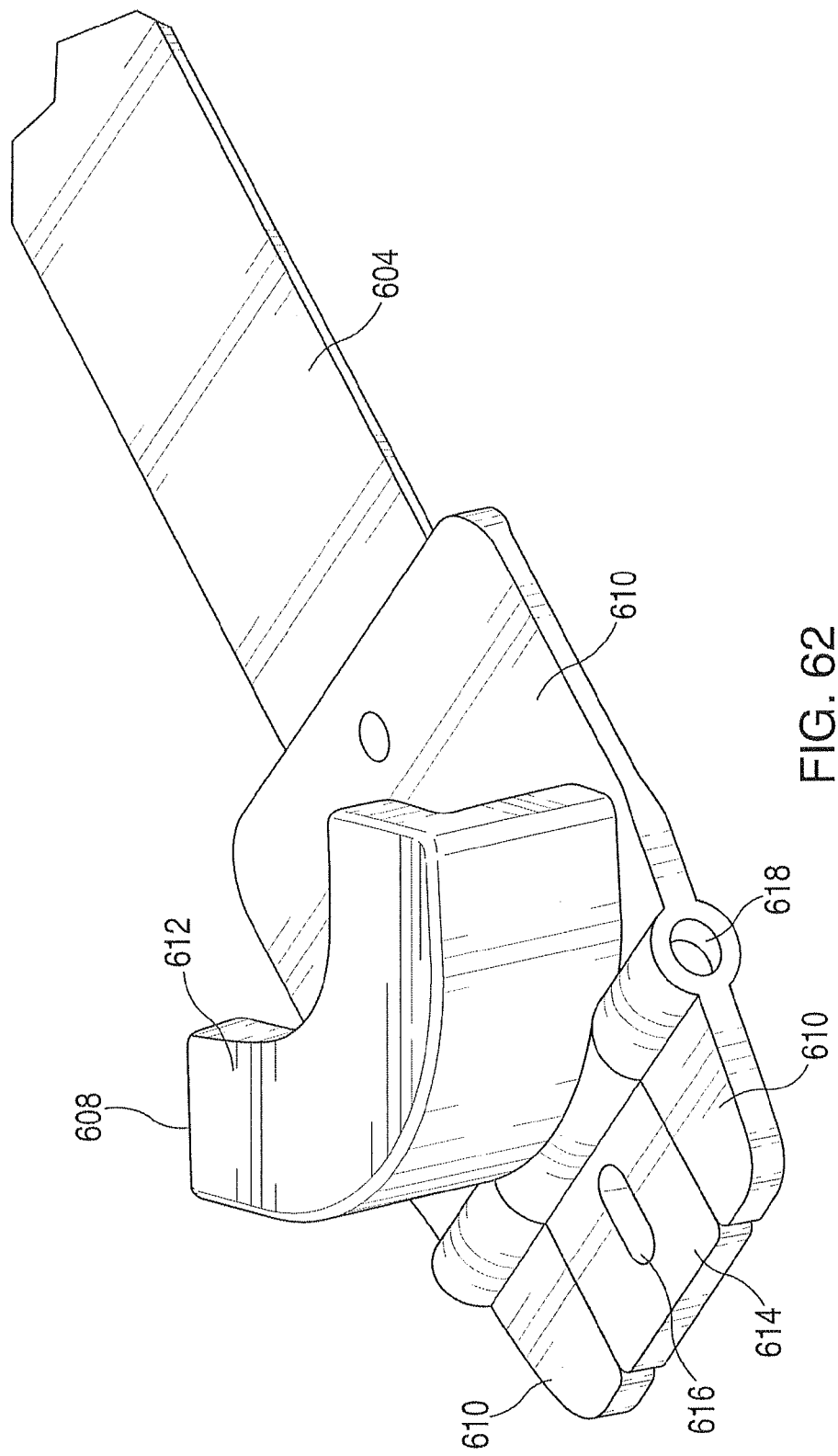
FIG. 62 is a perspective view of the proximal locking mechanism in the closed or engaged position.
Figure 63:
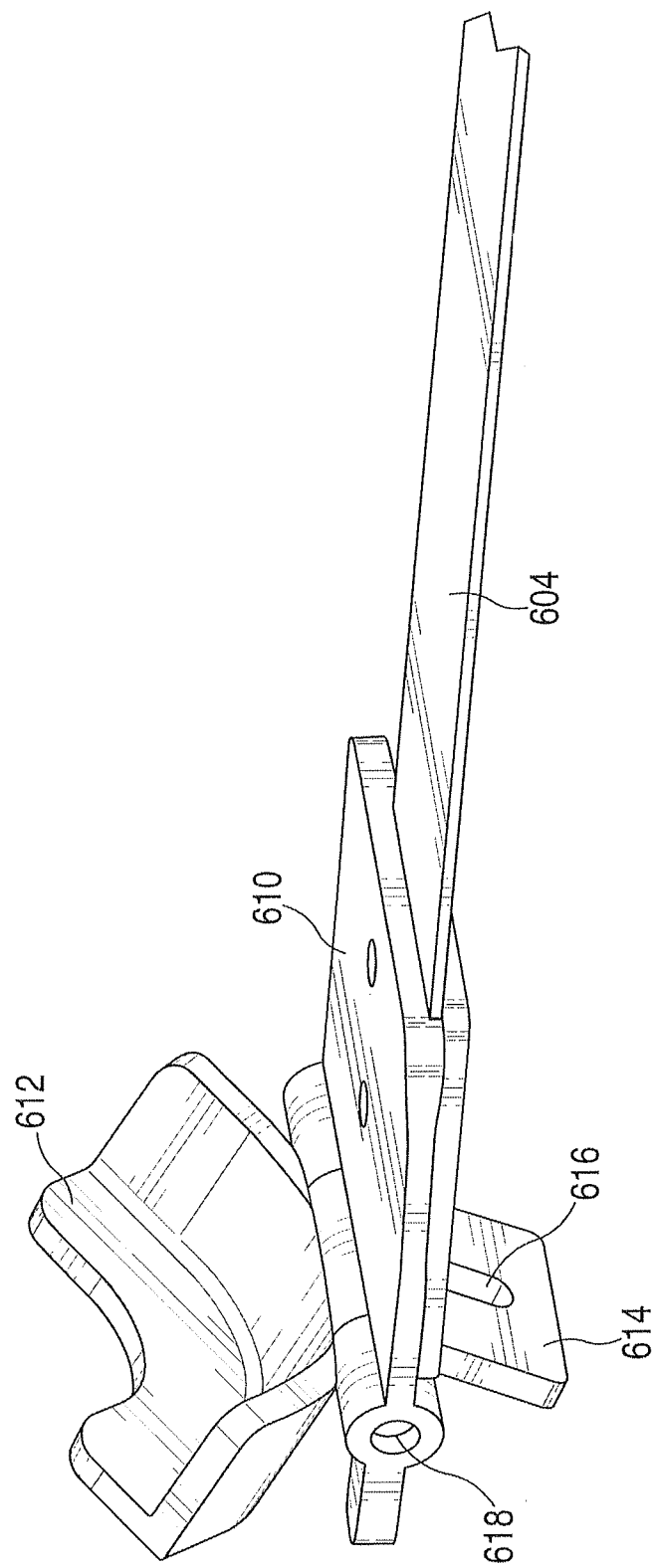
FIG. 63 is a perspective view of the proximal locking mechanism in the open position as it would be when engaging or disengaging the security apparatus to or from a tablet.
Figure 64:
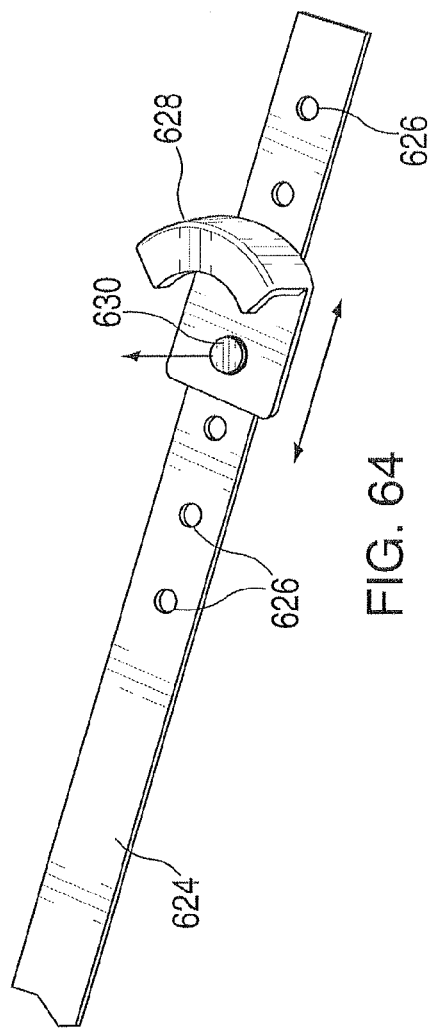
FIG. 64 is a perspective detail of an embodiment of this invention with adjustment for accommodating different sized tablets or similar devices by using a movable distal engagement pocket.

FIGS. 62 and 63 show proximal locking pocket assembly 608 in the closed and open positions respectively. Note that base 610 extends from the attachment portion to chassis bar 604 to the flanges at the proximal end on the other side of the integral hinge pin housing 618. Pocket 612 flips up (see FIG. 63) to permit a corner of tablet 601 to be inserted or disengaged. The hingeable tail section 614 fits between flange protrusions of base 610; when it is co-planar with base 610 (sec FIG. 62), the slot of pin lock 607 can be fit over the end and locked by its pin engaging hole 616. This completes the locking procedure.

Although purpose-sized security apparatus 600 of this invention can be provided for the most popular tablets or similar devices on the market, an adjustable single unit can also be configured. In one embodiment, the adjustability feature is formed by permitting metal chassis bar 624 in FIG. 64 to slide through a slot in a modified distal pocket 628. An array of holes 626 in chassis 624 provides the adjustability by virtue of a friction fit removable locking pin 630 with a large flat head. The pin cannot be taken out once tablet 601 is engaged, but it is simply lifted up for adjustment to permit pocket 628 to slide on bar 624.

Figure 65:
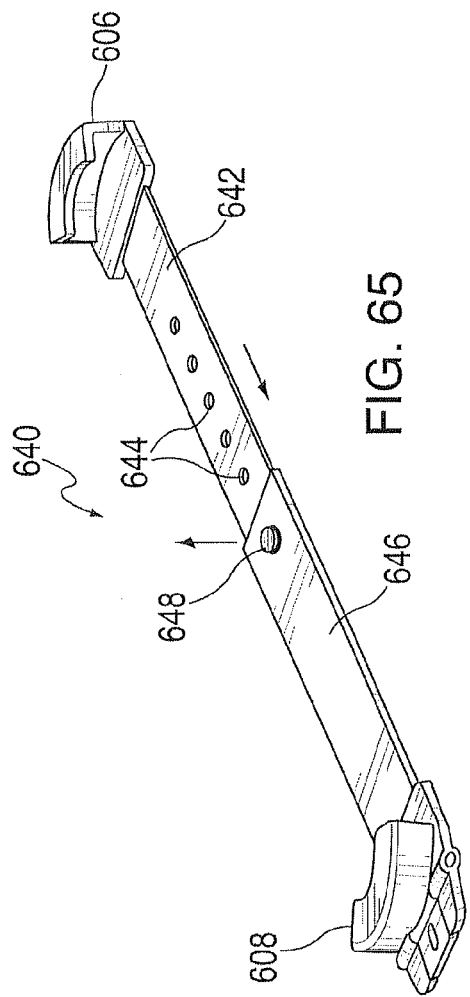
FIG. 65 is another adjustable embodiment using a telescoping chassis bar.

Another adjustable embodiment 640 shown in FIG. 65 uses a two-part telescoping metal chassis bar consisting of hollow proximal portion 646 and solid distal portion 642 which fits inside. An array of holes 644 provides adjustability by virtue of friction fit pin 648 with a large flat head. Again, this pin is locked once tablet 601 is installed. This embodiment is more compact for smaller tablets or like items since there is no distal metal bar extending beyond the distal engagement pocket as in embodiment of FIG. 64.

Please note that features of the above described locking assembly for securing a portable electronic device having at least one housing to a substantially immovable object, the locking assembly for securing a portable electronic device having a housing to a substantially immovable object and the method for securing a portable electronic device having a housing to a substantially immovable object utilizing a locking assembly are supported by the written description and drawing figures as filed. For example, the captive security rod and locking device find support in rod 291 and pin lock 100 of FIGS. 29 and 30, and the security rod or spike and cable with first end formed with a ferrule having a locking groove of FIG. 21 finds support in spike 285 and cable 210 of FIG. 29, and text describing same.

In the foregoing description, certain terms and visual depictions are used to illustrate the preferred embodiment. However, no unnecessary limitations are to be construed by the terms used or illustrations depicted, beyond what is shown in the prior art, since the terms and illustrations are exemplary only, and are not meant to limit the scope of the present invention.

It is further known that other modifications may be made to the present invention, without departing the scope of the invention.

What is claimed is:

1. A locking assembly for securing a portable electronic device having at least one housing to a substantially immovable object, the locking assembly comprising:
   a captive security rod having a locking end and an anchoring end, wherein the anchoring end is passed through the at least one housing to anchor the captive security rod thereto;
   said captive security rod partially in said at least one housing and partially out of said at least one housing during and before locking use; and
   a locking device with a locking mechanism, wherein the locking device is configured with an opening to receive the locking end of the captive security rod to activate the locking mechanism, where the activation causes the locking mechanism to securely grasp the locking end and thereby lock the security rod and portable electronic device to the locking device.

2. The locking assembly as set forth in claim 1, further comprising means for securing the locking device and, therefore, the captive security rod and portable electronic device to which the captive security rod is anchored, to a substantially non-movable object.

3. The locking assembly as set forth in claim 1, wherein the means for securing is a cable or lanyard.

4. The locking assembly as set forth in claim 3, wherein the cable or lanyard is permanently attached to the locking device.

5. The locking assembly as set forth in claim 1, wherein the locking end of the captive security rod comprises a knob that extends from the at least one housing after the anchoring end anchors the captive security rod thereto.

6. The locking assembly as set forth in claim 5, wherein the small knob that is captured and held by the locking mechanism at locking actuation.

7. The locking assembly as set forth in claim 1, wherein the captive security rod, upon anchoring to the at least one housing of the portable electronic device is stored in a recess and grasped to deploy in an extended position.

8. The locking assembly as set forth in claim 1, wherein the locking end of the captive security rod operates to collapse into the at least one housing during non-use.

9. The locking assembly as set forth in claim 1, wherein said portable electronic device comprises any of the group consisting of a laptop computer, a notebook computer, and tablet computer, a cell phone, a camera, a Smartphone, a music storage and a playback device.

10. The locking assembly as set forth in claim 1, wherein said portable electronic device comprises a first housing, a second housing and a hinge, wherein said hinge separates and allows said first housing to be closed upon said second housing and wherein said captive security rod is deployed to extend and protrude from any surface of said first housing or said second housing.

11. The locking assembly as set forth in claim 10, wherein said second housing is a keyboard part and said captive security rod is inserted through and anchored, and operates to extend in a deployed position out of a surface of said second housing.

12. The locking assembly as set forth in claim 1, wherein the substantially immovable object is a base plate.

13. The locking assembly as set forth in claim 2, wherein the cable or lanyard has a loop opposite its end permanently attached to the locking device through which the locking device is passed after the cable is wrapped around the substantially immovable object whereinafter the locking device is lockingly attached to the captive security rod and, therefore, the portable electronic device to which the captive security rod is anchored.

14. The locking assembly as set forth in claim 1, wherein the locking device is a pin lock.

15. The locking assembly as set forth in claim 1, wherein the locking device is a plunger-type security lock.

16. A method for securing a portable electronic device having a horsing to a substantially immovable object utilizing a locking assembly, the locking assembly comprising a captive security rod or spike formed with an anchoring end separated axially by a protruding end, said captive security rod being captive partially in said at least one housing and partially out of said at least one housing during and before locking use; a locking device with an internal locking mechanism and a cable permanently attached to the locking device at one end, the method comprising acts of:
   securedly fixing the anchoring end of the captive security rod or spike to the portable electronic device upon or through the housing;
   attaching an other end of the cable to the substantially immovable object; and
   inserting the protruding end of the captive, security rod into an opening in the locking device to actuate the internal locking mechanism and lock the locking device to the captive security rod and, therefore, the portable electronic device to which it is anchored, to the substantially immovable object.

* * * * *